(12) United States Patent
Iwase et al.

(10) Patent No.: US 11,523,040 B2
(45) Date of Patent: Dec. 6, 2022

(54) OPTICAL UNIT

(71) Applicant: Nidec Corporation, Kyoto (JP)

(72) Inventors: Takayuki Iwase, Kyoto (JP); Tomohiro Egawa, Kyoto (JP); Keishi Otsubo, Kyoto (JP); Kazuhiro Sazai, Kyoto (JP); Genki Tanaka, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 17 days.

(21) Appl. No.: 17/315,401

(22) Filed: May 10, 2021

(65) Prior Publication Data
US 2021/0368078 A1 Nov. 25, 2021

(30) Foreign Application Priority Data

May 22, 2020 (JP) .............................. JP2020-089925

(51) Int. Cl.
| H04N 5/225 | (2006.01) |
| G02B 27/64 | (2006.01) |
| H04M 1/02 | (2006.01) |
| G02B 7/02 | (2021.01) |
| B60R 11/00 | (2006.01) |
| G03B 15/00 | (2021.01) |

(Continued)

(52) U.S. Cl.
CPC ........... H04N 5/2257 (2013.01); G02B 7/021 (2013.01); G02B 7/023 (2013.01); G02B 27/646 (2013.01); H04M 1/0264 (2013.01); B60R 11/04 (2013.01); B60R 2011/0005 (2013.01); G03B 15/006 (2013.01); H05K 1/189 (2013.01)

(58) Field of Classification Search
CPC .... H04N 5/2257; H04N 5/2254; G02B 7/021; G02B 7/023; G02B 27/646; G02B 7/1805; G02B 7/182; G02B 7/1821; H04M 1/0264; B60R 11/04; B60R 2011/0005; G03B 15/006; G03B 2205/0007; G03B 2205/0046; G03B 2205/0053; G03B 5/00; G03B 17/17; G03B 30/00; G03B 17/12; H05K 1/189
See application file for complete search history.

(56) References Cited

U.S. PATENT DOCUMENTS 9,560,249 B2 * 1/2017 Imai ................... G02B 13/0065
10,488,631 B2 11/2019 Bachar et al.
(Continued)

FOREIGN PATENT DOCUMENTS

JP 2012-118336 A 6/2012
JP 6613005 B1 11/2019

Primary Examiner — Chiawei Chen
(74) Attorney, Agent, or Firm — Keating & Bennett

(57) ABSTRACT

An optical assembly includes an optical element including a reflection surface to reflect light in a first axis direction, a holder to hold the optical element, a case to support the holder, a first swing mechanism to swing the holder around a first swing axis, and a second swing mechanism to swing the holder around a second swing axis perpendicular to the first swing axis. The holder includes first and second protrusions. The case includes first and second recesses. Each of the recesses includes a first side surface located on one side in the axial direction of the second swing axis and a second side surface located on the other side with respect to the corresponding protrusion. At least one of the first and second side surfaces includes an inclined surface inclined with respect to the second swing axis.

13 Claims, 16 Drawing Sheets

(51) Int. Cl.
  *H05K 1/18*    (2006.01)
  *B60R 11/04*   (2006.01)

(56) References Cited

U.S. PATENT DOCUMENTS

| | | | |
|---|---|---|---|
| 10,516,773 | B2 | 12/2019 | Yoon et al. |
| 10,678,062 | B2 | 6/2020 | Im et al. |
| 10,942,298 | B2 * | 3/2021 | Fu .................. G02B 6/0025 |
| 2018/0224665 | A1 * | 8/2018 | Im .................. G02B 26/0816 |
| 2019/0129197 | A1 | 5/2019 | Kim et al. |
| 2019/0227201 | A1 * | 7/2019 | Kao .................. G02B 27/0977 |
| 2019/0227406 | A1 * | 7/2019 | Wang .................. G02B 27/0955 |
| 2019/0230255 | A1 | 7/2019 | Fu et al. |
| 2020/0333622 | A1 | 10/2020 | Fujisaka et al. |
| 2021/0136261 | A1 * | 5/2021 | Lee .................. G03B 30/00 |

* cited by examiner

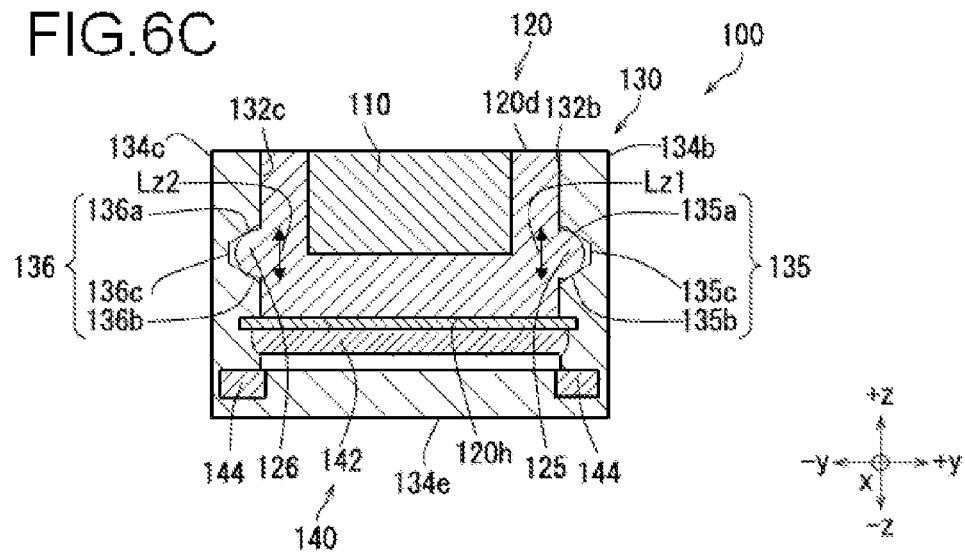
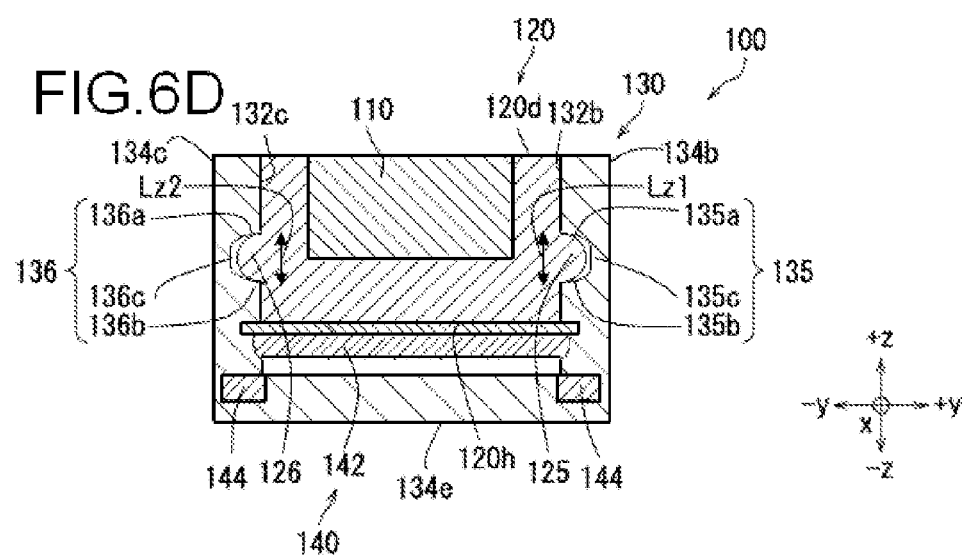
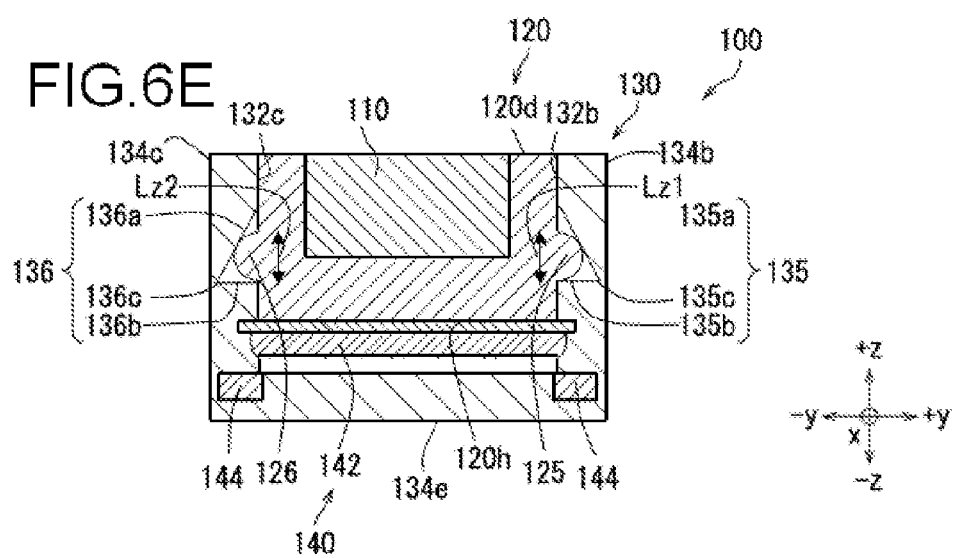

OPTICAL UNIT

CROSS REFERENCE TO RELATED APPLICATION

The present invention claims priority under 35 U.S.C. § 119 to Japanese Application No. 2020-089925, filed on May 22, 2020, the entire contents of which is hereby incorporated herein by reference.

1. FIELD OF THE INVENTION

The present disclosure relates to an optical assembly.

2. BACKGROUND

An image blur may occur due to camera shake during shooting of a still image or a moving image with a camera. For this reason, an image stabilizer has been put into practical use to enable shooting of a clear image with image blur being reduced. When the camera shakes, the image stabilizer can address a problem caused by the camera shake by correcting the position and orientation of a camera module according to the camera shake.

In addition, there is a zoom camera module with folded optics including various lens groups and prisms for miniaturization of the camera module. Further, an actuator for rotating or tilting an optical element may be used, the actuator including two curved ball guide mechanisms which are activated to cause rotation or inclination around first and second rotation axes.

However, in the actuator described above, the prism is rotated by rotating the two rotation axes by two curved ball guide mechanisms, so that it is impossible to reduce or prevent deviation of the optical axis with a simple configuration.

SUMMARY

An example optical assembly according to an example embodiment of the present disclosure includes an optical element including a reflection surface to reflect light in a first axis direction, a holder to hold the optical element, a case to support the holder in a swingable manner, a first swing mechanism to swing the holder around a first swing axis with respect to the case, and a second swing mechanism to swing the holder around a second swing axis perpendicular or substantially perpendicular to the first swing axis with respect to the case. The holder includes a first protrusion on a first case opposing surface that opposes the case, the first protrusion protruding toward the case, and a second protrusion on a second case opposing surface that opposes the case, the second protrusion protruding toward the case. The case includes a first recess in a first holder opposing surface that opposes the first case opposing surface of the holder, the first recess housing at least a portion of the first protrusion, and a second recess in a second holder opposing surface that opposes the second case opposing surface of the holder, the second recess housing at least a portion of the second protrusion. The first recess includes a first side surface located on one side in an axial direction of the second swing axis with respect to the first protrusion, and a second side surface located on another side in the axial direction of the second swing axis with respect to the first protrusion, the second side surface being connected to the first side surface. The second recess includes a first side surface located on one side in the axial direction of the second swing axis with respect to the second protrusion, and a second side surface located on the another side in the axial direction of the second swing axis with respect to the second protrusion, the second side surface being connected to the first side surface. At least one of the first side surface and the second side surface of the first recess includes an inclined surface inclined with respect to the second swing axis. At least one of the first side surface and the second side surface of the second recess includes an inclined surface inclined with respect to the second swing axis.

The above and other elements, features, steps, characteristics and advantages of the present disclosure will become more apparent from the following detailed description of the example embodiments with reference to the attached drawings.

BRIEF DESCRIPTION OF THE DRAWINGS

FIGS. 6C to 6E are sectional views taken along line VIa-VIa in modifications.

DETAILED DESCRIPTION

Figure 1:
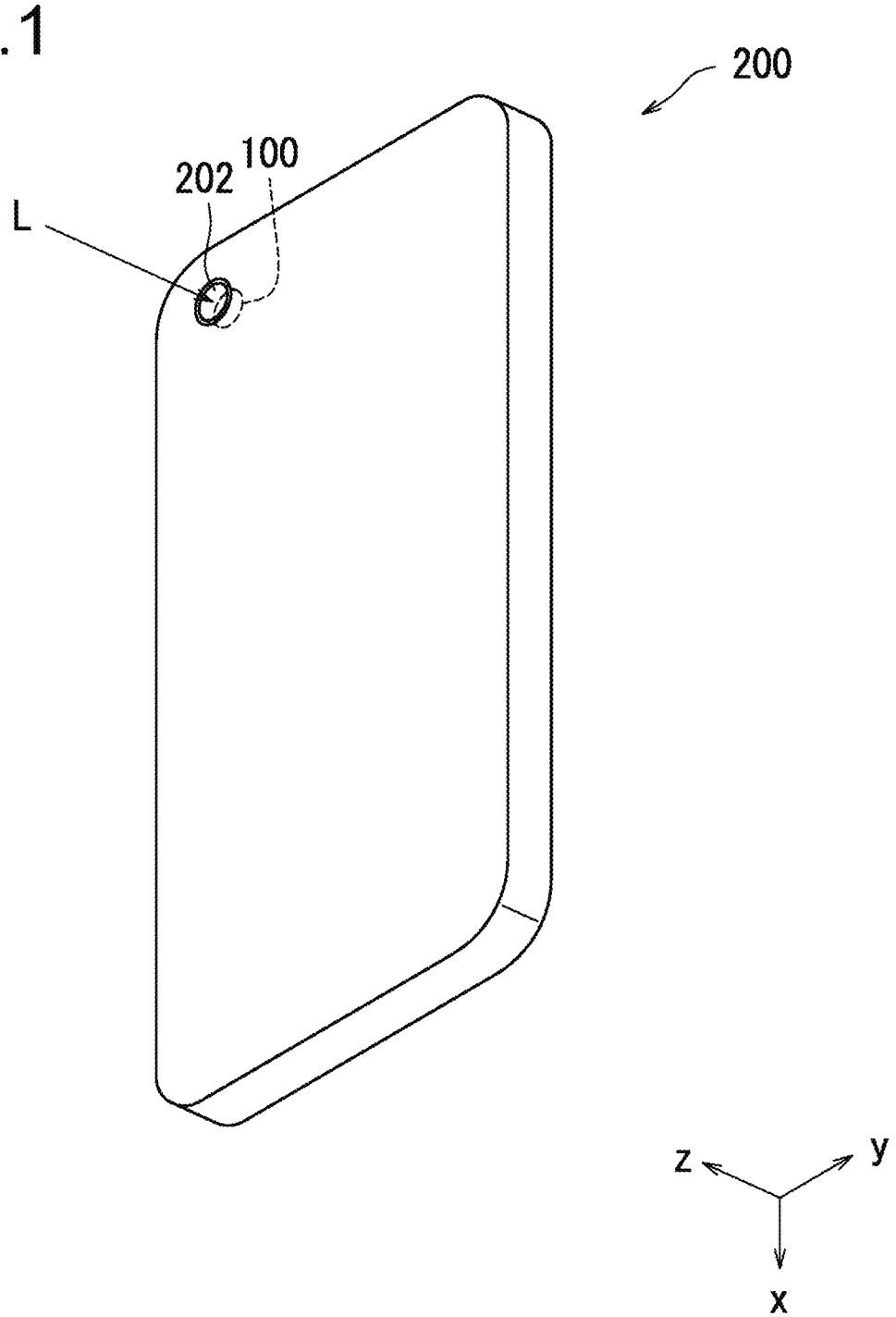
FIG. 1 is a schematic perspective view of a smartphone including an optical assembly according to a first example embodiment of the present disclosure.

Example embodiments of optical assemblies according to the present disclosure will be described below with reference to the drawings. In the drawings, the same or corresponding parts are designated by the same reference signs, and the description thereof will not be repeated. In the specification of the present application, an x axis, a y axis, and a z axis that are orthogonal to each other may be described in order to facilitate the understanding of the disclosure.

An optical assembly 100 reflects incident light in a specific direction. The optical assembly 100 is suitably used as, for example, an optical component of a smartphone.

First, a smartphone 200 equipped with the optical assembly 100 according to the present example embodiment will be described with reference to FIG. 1. FIG. 1 is a schematic perspective view of the smartphone 200 equipped with the optical assembly 100 according to the present example embodiment.

The optical assembly 100 can be reduced in thickness. As a result, the length (thickness) of the smartphone 200 along the z axis direction can be reduced. The optical assembly 100 is not limited to be used for the smartphone 200, and can be used for various devices such as cameras and videos without particular limitation.

As shown in FIG. 1, the smartphone 200 includes a lens 202 on which light is incident. In the smartphone 200, the optical assembly 100 is disposed inside the lens 202. Light L enters the smartphone 200 from the outside through the lens 202 in the incident direction, and a subject image is captured on the basis of the light that has passed through the optical assembly 100.

Figure 2A:
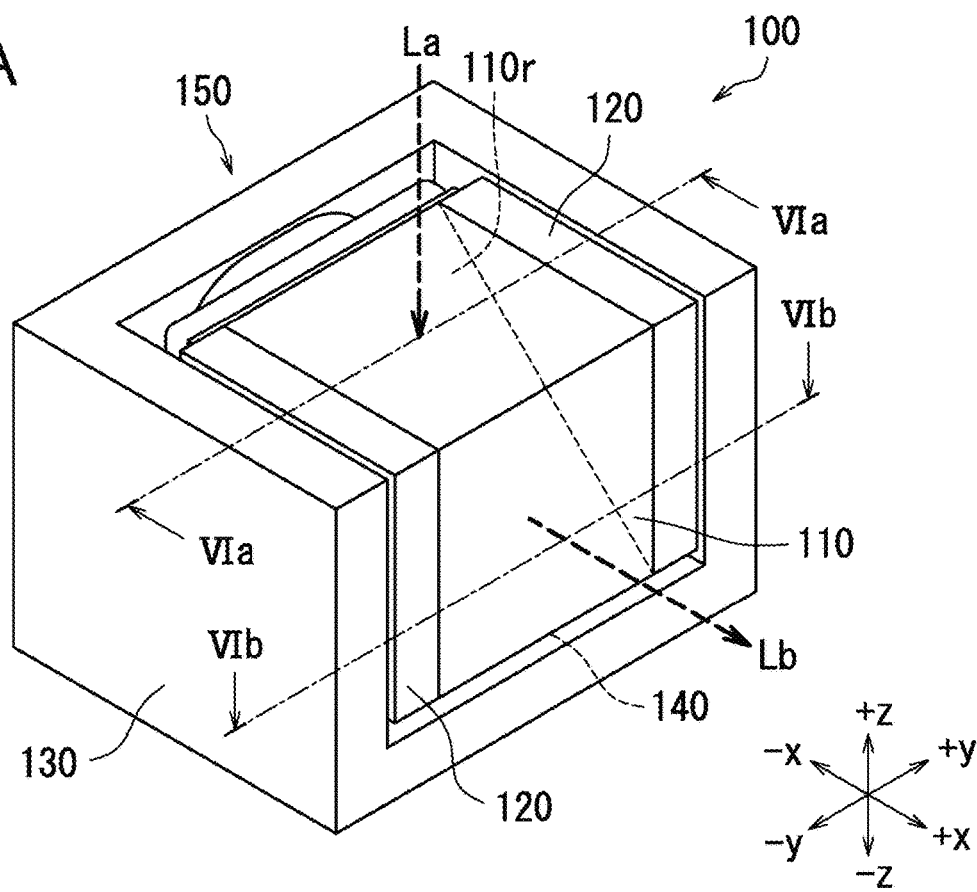
FIG. 2A is a schematic perspective view of the optical assembly according to the first example embodiment.

Next, the configuration of the optical assembly 100 according to the present example embodiment will be described with reference to FIGS. 2A and 2B. FIG. 2A is a schematic perspective view of the optical assembly 100 according to the present example embodiment, and FIG. 2B is a schematic perspective view of the optical assembly 100 according to the present example embodiment and a lens module 210 and an image sensor 220 corresponding to the optical assembly 100.

Figure 2B:
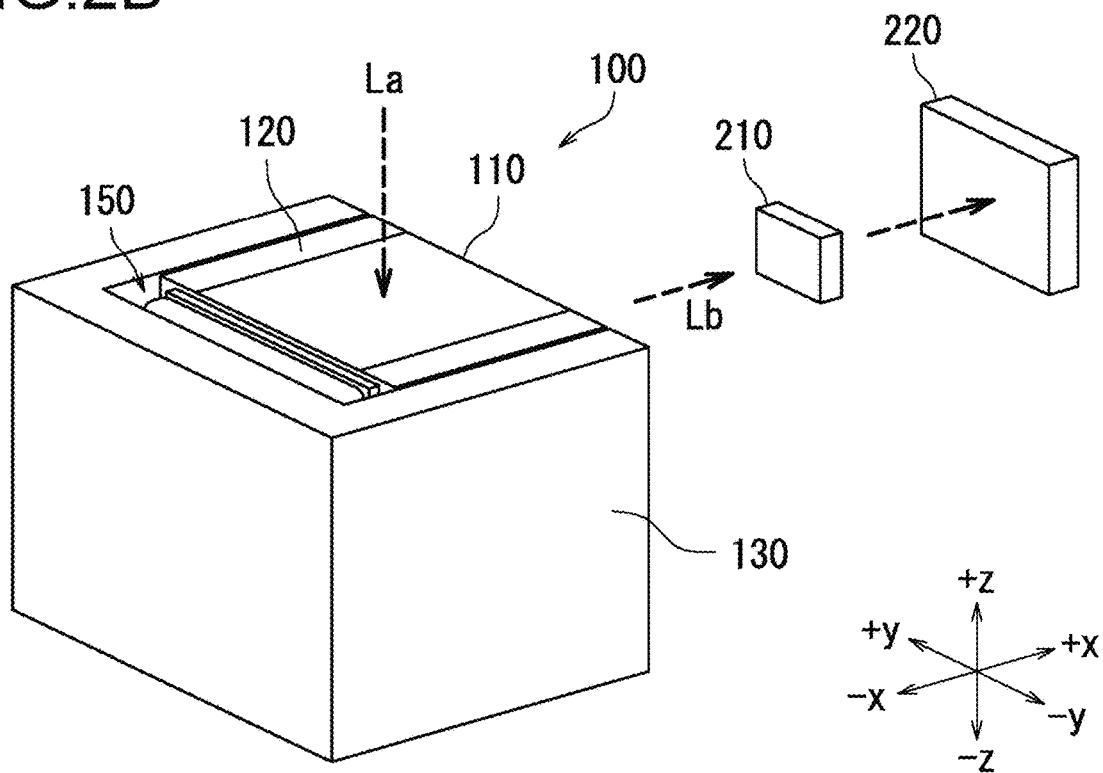
FIG. 2B is a schematic perspective view of the optical assembly according to the first example embodiment, and a lens module and an image sensor corresponding to the optical assembly.

As shown in FIGS. 2A and 2B, the optical assembly 100 reflects incident light La incident along the z axis direction as reflected light Lb in the x axis direction. In this specification, the x axis direction, the y axis direction, and the z axis direction may be referred to as a first axis direction, a second axis direction, and a third axis direction, respectively. Further, in the present specification, axes around which the optical assembly 100 swings may be referred to as a first swing axis and a second swing axis. Here, the first swing axis is an axis perpendicular to the incident light La and the reflected light Lb (that is, parallel to the y axis direction), and the second swing axis is an axis parallel to either the incident light La or the reflected light Lb (that is, parallel to either the x axis direction or the z axis direction). Furthermore, in the following description, the radial direction around the first or second swing axis and the circumferential direction around the first or second swing axis mean the radial direction and the circumferential direction of a virtual circle around each swing axis.

In the first example embodiment of the present disclosure, the second swing axis is parallel to the reflected light Lb (that is, parallel to the z axis direction). The optical assembly 100 includes an optical element 110, a holder 120, a case 130, a first swing mechanism 140, and a second swing mechanism 150. As shown in FIGS. 2A and 2B, the second swing mechanism 150 is located on the side in the −x direction with respect to the optical element 110, and the first swing mechanism 140 is invisible from the outside of the optical assembly 100. The first swing mechanism 140 is located on the side in the −z direction with respect to the optical element 110 and the holder 120.

The optical element 110 has a reflection surface 110r that reflects light in the x axis direction. The reflection surface 110r is provided obliquely with respect to each of the xy plane and the yz plane. The reflection surface 110r reflects the incident light La incident along the −z axis direction as the reflected light Lb in the +x axis direction.

For example, the optical element 110 includes a prism. The prism is made of a substantially single transparent material that has a higher refractive index than air. Since the optical element 110 includes the prism, the length of an optical path passing through the optical assembly 100 can be reduced.

The holder 120 holds the optical element 110. The holder 120 holds the optical element 110 from surfaces located on both sides of the optical element 110 along the y axis direction and a surface located on the side in the −z axis direction. Typically, the holder 120 is made of resin.

The case 130 supports the holder 120 in a swingable manner. The case 130 supports the holder 120 from both ends in the y axis direction. The holder 120 swings with respect to the case 130. The holder 120 swings around the y axis with respect to the case 130. Further, the holder 120 swings around the z axis with respect to the case 130. On the other hand, in the optical assembly 100, the swing of the holder 120 around the x axis with respect to the case 130 is restricted. Typically, the case 130 is made of resin or metal.

The first swing mechanism 140 is located on the side in the −z direction with respect to the holder 120. The first swing mechanism 140 swings the holder 120 around the y axis with respect to the case 130.

The second swing mechanism 150 is located on the side in the −x direction with respect to the holder 120. The second swing mechanism 150 swings the holder 120 around the z axis with respect to the case 130.

As shown in FIG. 2B, the optical assembly 100 reflects incident light La incident along the z axis direction as reflected light Lb in the x axis direction. Thereafter, the reflected light Lb is received by the image sensor 220 via the lens module 210 of the smartphone 200. The lens module 210 may include various lenses depending on intended use.

In the optical assembly 100 according to the present example embodiment, the holder 120 is supported in a swingable manner with respect to the case 130. The holder 120 can swing around the y axis and the z axis with respect to the case 130, while the swing around the x axis is restricted.

Figure 3A:
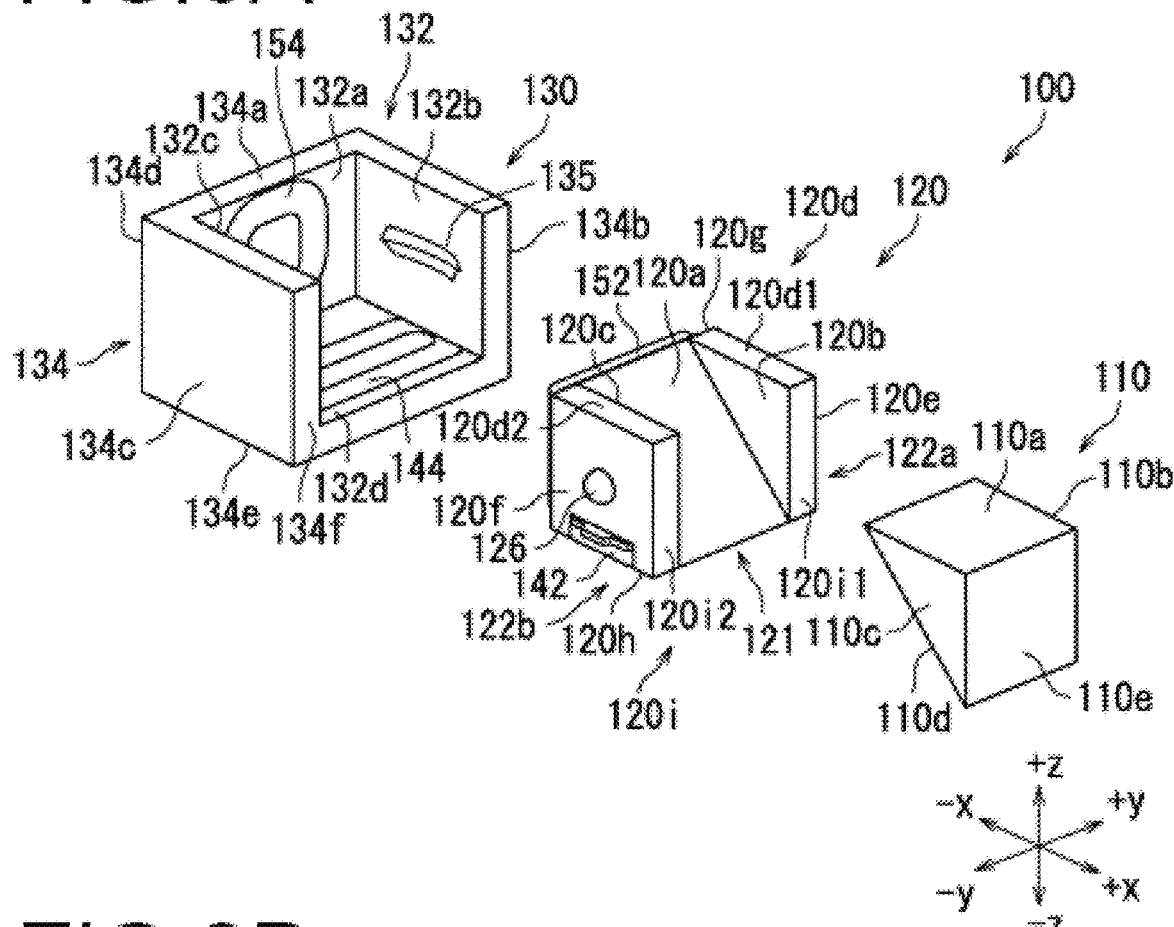
FIGS. 3A and 3B are schematic exploded perspective views of an optical element, a holder, and a case in the optical assembly according to the first example embodiment.
Figure 3B:
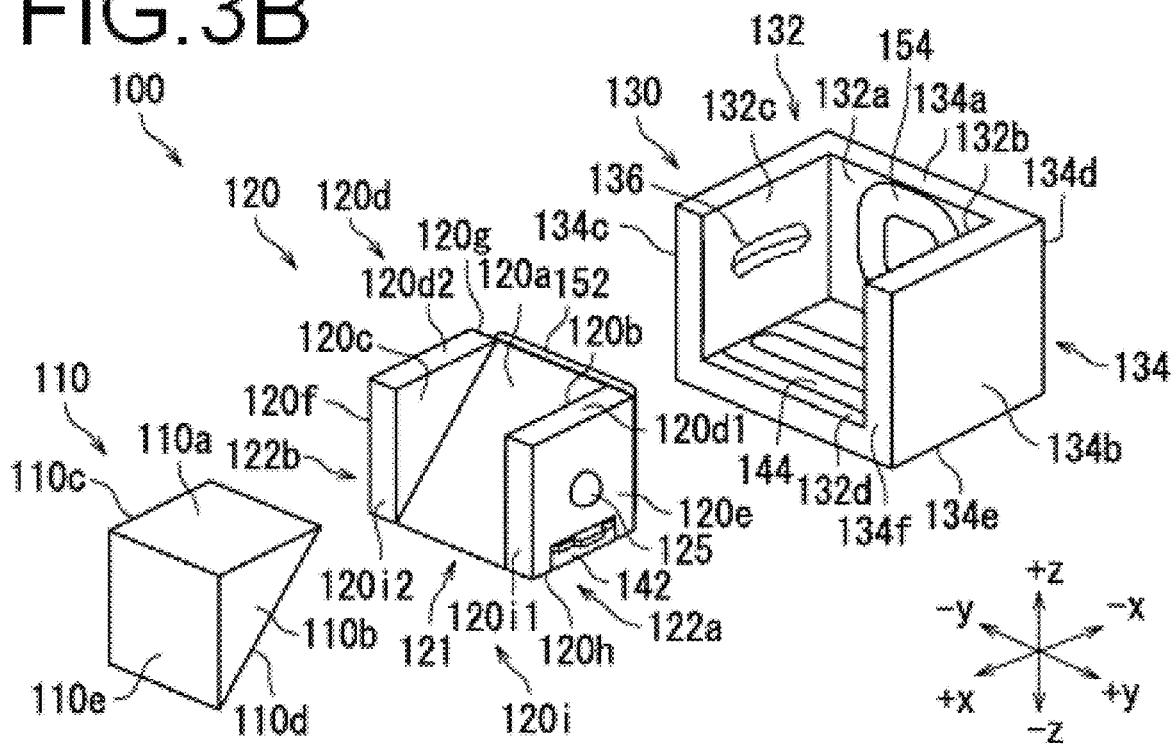

Next, the configuration of the optical assembly 100 according to the present example embodiment will be described with reference to FIGS. 3A and 3B. FIGS. 3A and 3B are exploded perspective views of the optical element 110, the holder 120, and the case 130 in the optical assembly 100 according to the present example embodiment.

As can be seen from FIG. 3A, the optical element 110 is mounted on the holder 120. Further, the holder 120 is mounted to the case 130 together with the optical element 110.

As shown in FIGS. 3A and 3B, the optical element 110 has a substantially triangular prism shape. The optical element 110 has a surface 110a, a surface 110b, a surface 110c, a surface 110d, and a surface 110e. The normal of the surface 110a is parallel to the z axis direction and points in the +z direction.

The surface 110b is connected to the surface 110a and is perpendicular to the surface 110a. The normal of the surface 110b is parallel to the y axis direction and points in the +y direction. The surface 110c is connected to the surface 110a and is perpendicular to the surface 110a. The normal of the surface 110c is parallel to the y axis direction and points in the −y direction.

The surface 110d is connected to the surfaces 110a, 110b, and 110c. The surface 110d intersects the xy plane at an angle. Here, the surface 110d is the reflection surface 110r in FIGS. 2A and 2B. The surface 110e is connected to the surface 110a, the surface 110b, the surface 110c, and the surface 110d, and is perpendicular to the surface 110a, the surface 110b, and the surface 110c. The normal of the surface 110e is parallel to the x axis direction and points in the +x direction.

The holder 120 has a substantially cuboid shape with a part of the central portion removed. The holder 120 has a surface 120a, a surface 120b, a surface 120c, a surface 120d, a surface 120e, a surface 120f, a surface 120g, a surface 120h, and a surface 120i.

The surface 120a intersects the xy plane at an angle. The length of the surface 120a in the y direction is substantially equal to the length of the optical element 110 in the y direction, but the length of the surface 120a in the y direction is slightly larger than the length of the optical element 110 in the y direction.

The surface 120b is connected to the surface 120a and is perpendicular to the surface 120a. The normal of the surface 120b is parallel to the y axis direction and points in the −y direction. The surface 120c faces the surface 120b. The surface 120c is connected to the surface 120a and is perpendicular to the surface 120a. The normal of the surface 120c is parallel to the y axis direction and points in the +y direction.

The optical element 110 is mounted on the surfaces 120a, 120b, and 120c of the holder 120. The surfaces 120a, 120b, and 120c define the inner peripheral surface of the holder 120. Further, the optical element 110 is attached to the surface 120a of the holder 120. In the present specification, the surface 120a of the holder 120 may be referred to as an optical element mounting surface.

The normal of the surface 120d is parallel to the z axis direction and points in the +z direction. The surface 120d is divided into a surface 120d1 and a surface 120d2 by the surface 120a. The surface 120d1 is located on the side in the +y direction with respect to the surface 120a, and the surface 120d2 is located on the side in the −y direction with respect to the surface 120a.

The surface 120e is connected to the surface 120d1 and is perpendicular to the surface 120d1. The normal of the surface 120e is parallel to the y axis direction and points in the +y direction. When the holder 120 is attached to the case 130, the surface 120e of the holder 120 faces the case 130. In the present specification, the surface 120e of the holder 120 may be referred to as a first case opposing surface.

The surface 120f is connected to the surface 120d2 and is perpendicular to the surface 120d2. The normal of the surface 120f is parallel to the y axis direction and points in the −y direction. When the holder 120 is attached to the case 130, the surface 120f of the holder 120 faces the case 130. In the present specification, the surface 120f of the holder 120 may be referred to as a second case opposing surface.

The surface 120g is connected to the surface 120a, the surface 120d1, the surface 120d2, the surface 120e, and the surface 120f, and is perpendicular to the surface 120d1, the surface 120d2, the surface 120e, and the surface 120f. The normal of the surface 120g is parallel to the x axis direction and points in the −x direction. The surface 120h is connected to the surface 120e, the surface 120f, and the surface 120g, and is perpendicular to the surface 120e, the surface 120f, and the surface 120g. The normal of the surface 120h is parallel to the z axis direction and points in the −z direction.

The normal of the surface 120i is parallel to the x axis direction and points in the +x direction. The surface 120i is connected to the surface 120d, the surface 120e, the surface 120f, and the surface 120h, and is perpendicular to the surface 120d, the surface 120e, the surface 120f, and the surface 120h. The surface 120i is divided into a surface 120i1 and a surface 120i2 by the surface 120a. The surface 120i1 is located on the side in the +y direction with respect to the surface 120a, and the surface 120i2 is located on the side in the −y direction with respect to the surface 120a.

As shown in FIGS. 3A and 3B, the holder 120 has a mounting section 121, a first end section 122a, a second end section 122b, a first protrusion 125, and a second protrusion 126. The optical element 110 is attached to the mounting section 121. The first end section 122a is located on the side in the +y direction with respect to the mounting section 121. The second end section 122b is located on the side in the −y direction with respect to the mounting section 121. The mounting section 121 is located between the first end section 122a and the second end section 122b.

The surface 120e is the outer surface of the first end section 122a on the side in the +y direction. As described above, the surface 120e is the first case opposing surface that opposes the case 130. The first protrusion 125 is provided on the first case opposing surface (surface 120e) that opposes the case 130. Here, the first protrusion 125 is located at the center of the first case opposing surface (surface 120e). When the holder 120 is attached to the case 130, the first protrusion 125 protrudes toward the case 130.

The surface 120f is the outer surface of the second end section 122b on the side in the −y direction. As described above, the surface 120f is the second case opposing surface that opposes the case 130. The second protrusion 126 is provided on the second case opposing surface (surface 120f) that opposes the case 130. Here, the second protrusion 126 is located at the center of the second case opposing surface (surface 120f). When the holder 120 is attached to the case 130, the second protrusion 126 protrudes toward the case 130.

The case 130 has a substantially cuboid shape in which a smaller substantially cuboid shape is partially removed from two adjacent surfaces. The case 130 has an inner peripheral surface 132 and an outer peripheral surface 134. The inner peripheral surface 132 has a surface 132a, a surface 132b, a surface 132*c*, and a surface 132*d*. The normal of the surface 132*a* is parallel to the x axis direction and points in the +x direction.

The surface 132*b* is connected to the surface 132*a* and is perpendicular to the surface 132*a*. The normal of the surface 132*b* is parallel to the y axis direction and points in the −y direction. The surface 132*c* is connected to the surface 132*a* and is perpendicular to the surface 132*a*. The normal of the surface 132*c* is parallel to the y axis direction and points in the +y direction.

The surface 132*d* is connected to the surface 132*a*, the surface 132*b*, and the surface 132*c*, and is perpendicular to the surface 132*a*, the surface 132*b*, and the surface 132*c*. The normal of the surface 132*d* is parallel to the z axis direction and points in the +z direction.

The holder 120 is mounted on the inner peripheral surface 132 of the case 130. When the holder 120 is mounted on the inner peripheral surface 132 of the case 130, the surface 120*g*, the surface 120*e*, the surface 120*f*, and the surface 120*h* of the holder 120 face the surface 132*a*, the surface 132*b*, the surface 132*c*, and the surface 132*d* of the case 130, respectively.

As described above, in the present specification, the surface 120*e* of the holder 120 may be referred to as the first case opposing surface, and the surface 120*f* of the holder 120 may be referred to as the second case opposing surface. In the present specification, in the case 130, the surface 132*b* corresponding to the surface 120*e* of the holder 120 may be referred to as a first holder opposing surface, and the surface 132*c* corresponding to the surface 120*f* of the holder 120 may be referred to as a second holder opposing surface.

The outer peripheral surface 134 has a surface 134*a*, a surface 134*b*, a surface 134*c*, a surface 134*d*, a surface 134*e*, and a surface 134*f*. The normal of the surface 134*a* is parallel to the z axis direction and points in the +z direction. The surface 134*a* is connected to each of the surface 132*a*, the surface 132*b*, and the surface 132*c*, and is perpendicular to the surface 132*a*, the surface 132*b*, and the surface 132*c*.

The surface 134*b* is connected to the surface 134*a* and is perpendicular to the surface 134*a*. The normal of the surface 134*b* is parallel to the y axis direction and points in the +y direction. The surface 134*c* is connected to the surface 134*a* and is perpendicular to the surface 134*a*. The normal of the surface 134*c* is parallel to the y axis direction and points in the −y direction.

The surface 134*d* is connected to the surface 134*a*, the surface 134*b*, and the surface 134*c*, and is perpendicular to the surface 134*a*, the surface 134*b*, and the surface 134*c*. The normal of the surface 134*d* is parallel to the x axis direction and points in the −x direction. The surface 134*e* is connected to the surface 134*b*, the surface 134*c*, and the surface 134*d*, and is perpendicular to the surface 134*b*, the surface 134*c*, and the surface 134*d*. The normal of the surface 134*e* is parallel to the z axis direction and points in the −z direction.

The surface 134*f* is connected to the surface 134*b*, the surface 134*c*, and the surface 134*e*, and is perpendicular to the surface 134*b*, the surface 134*c*, and the surface 134*e*. Further, the surface 134*f* is connected to each of the surface 132*a*, the surface 132*b*, and the surface 132*c*, and is perpendicular to the surface 132*a*, the surface 132*b*, and the surface 132*c*. The normal of the surface 134*f* is parallel to the x axis direction and points in the +x direction.

The case 130 has a first recess 135. The first recess 135 is formed in the first holder opposing surface (132*b*) that opposes the first case opposing surface (120*e*) of the holder 120. The first recess 135 houses at least a part of the first protrusion 125. Here, the first recess 135 extends in the x axis direction. The length of the first recess 135 in the x axis direction is larger than the length of the first protrusion 125 in the x axis direction.

The case 130 has a second recess 136. The second recess 136 is formed in the second holder opposing surface (132*c*) that opposes the second case opposing surface (120*f*) of the holder 120. The second recess 136 houses at least a part of the second protrusion 126. Here, the second recess 136 extends in the x axis direction. The length of the second recess 136 in the x axis direction is larger than the length of the second protrusion 126 in the x axis direction.

According to the optical assembly 100 of the present example embodiment, when the holder 120 is mounted on the case 130, the first protrusion 125 protrudes from the first end section 122*a* toward the case 130. Further, the first case opposing surface (surface 120*e*) provided with the first protrusion 125 faces the first holder opposing surface (surface 132*b*) provided with the first recess 135, and the first recess 135 houses at least a portion the first protrusion 125. Therefore, the first protrusion 125 which is housed in the first recess 135 can be moved in the first recess 135.

Similarly, the second protrusion 126 protrudes from the second end section 122*b* toward the case 130. Further, the second case opposing surface (surface 120*f*) provided with the second protrusion 126 faces the second holder opposing surface (surface 132*c*) provided with the second recess 136, and the second recess 136 houses at least a portion the second protrusion 126. Therefore, the second protrusion 126 which is housed in the second recess 136 can be moved in the second recess 136.

Figure 4A:
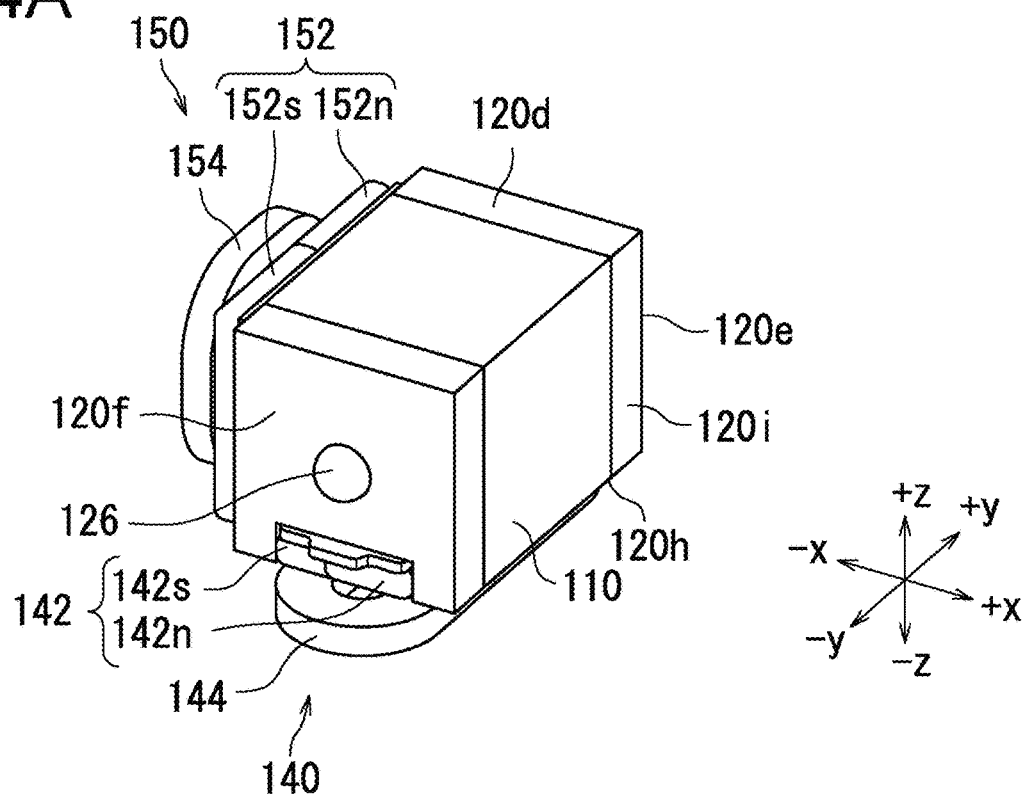
FIGS. 4A and 4B are schematic perspective views of the case, a first swing mechanism, and a second swing mechanism in the optical assembly according to the first example embodiment.
Figure 4B:
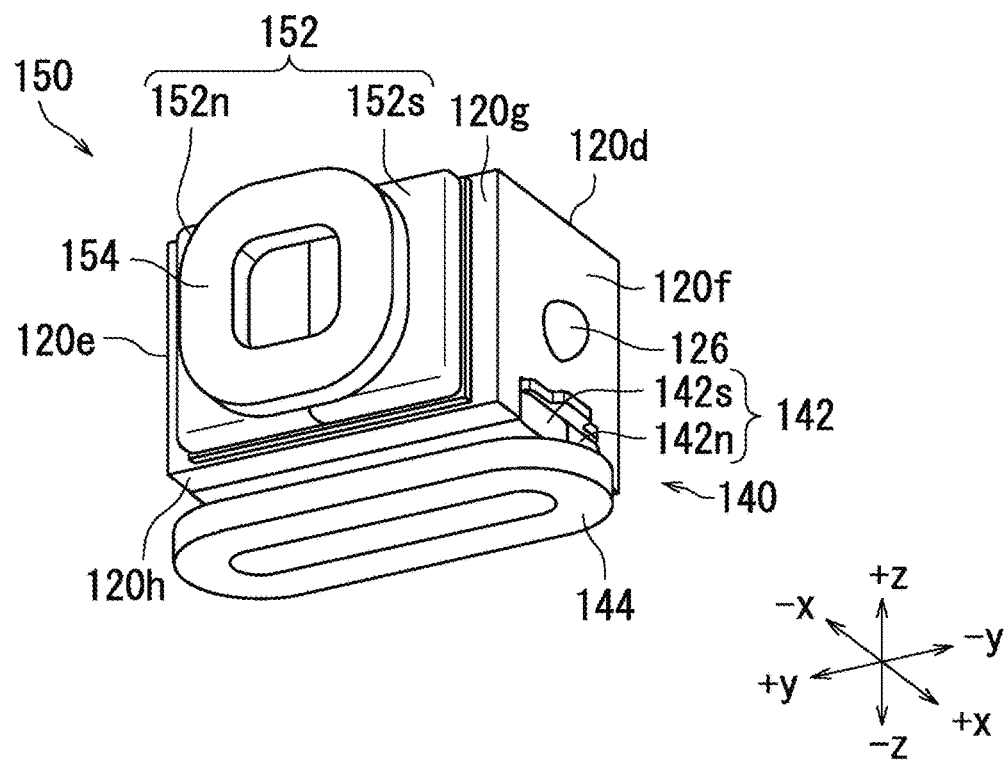

Next, the holder 120, the first swing mechanism 140, and the second swing mechanism 150 in the optical assembly 100 according to the present example embodiment will be described with reference to FIGS. 3A, 3B, 4A, and 4B. FIGS. 4A and 4B are schematic perspective views of the holder 120, the first swing mechanism 140, and the second swing mechanism 150 in the optical assembly 100 according to the present example embodiment. FIGS. 4A and 4B do not illustrate the case 130 except for a first coil 144 and a second coil 154.

The first swing mechanism 140 includes a first magnet 142 and the first coil 144. The first magnet 142 is provided on one of the holder 120 and the case 130, and the first coil 144 is provided on the other of the holder 120 and the case 130 with respect to the first magnet 142. Specifically, one of the first magnet 142 and the first coil 144 is provided on the surface 120*h* of the holder 120, and the other of the first magnet 142 and the first coil 144 is provided on the surface 132*d* of the case 130 or inside the case 130 at a position facing the surface 132*d*. In the present specification, the surface 120*h* of the holder 120 may be referred to as a first swing mechanism mounting surface.

Here, the first magnet 142 is attached to the holder 120. Specifically, the first magnet 142 is attached to the surface 120*h* of the holder 120. The first magnet 142 has an N pole 142*n* and an S pole 142*s*. The N pole 142*n* and the S pole 142*s* each extend in the y direction and are arranged side by side in the x direction.

The first coil 144 is provided in the case 130. By switching the direction of a current flowing through the first coil 144, the first magnet 142 receives a force along the x axis direction.

The second swing mechanism 150 includes a second magnet 152 and the second coil 154. The second magnet 152 is provided on one of the holder 120 and the case 130, and the second coil 154 is provided on the other of the holder 120 and the case 130 with respect to the second magnet 152.

Specifically, one of the second magnet 152 and the second coil 154 is provided on the surface 120g of the holder 120, and the other of the second magnet 152 and the second coil 154 is provided on the surface 132a of the case 130 or inside the case 130 at a position facing the surface 132a. In the present specification, the surface 120g of the holder 120 may be referred to as a second swing mechanism mounting surface.

Here, the second magnet 152 is attached to the holder 120. Specifically, the second magnet 152 is attached to the surface 120g of the holder 120. The second magnet 152 has an N pole 152n and an S pole 152s. The N pole 152n and the S pole 152s each extend in the z direction and are arranged side by side in the y direction.

The second coil 154 is provided in the case 130. By switching the direction of a current flowing through the second coil 154, the second magnet 152 receives a force along the y axis direction.

As shown in FIGS. 4A and 4B, it is preferable that the holder 120 includes the first magnet 142 and the second magnet 152, and the case 130 includes the first coil 144 and the second coil 154. With this configuration, the swing of the holder 120 with respect to the case 130 can be easily controlled by passing a current through the first coil 144 and/or the second coil 154 of the case 130.

As described above, the first swing mechanism mounting surface (surface 120h) is connected to the first case opposing surface (surface 120e) and the second case opposing surface (surface 120f). Further, the first swing mechanism mounting surface (surface 120h) has a normal parallel to the z axis direction. Further, the second swing mechanism mounting surface (surface 120g) is connected to the first case opposing surface (surface 120e) and the second case opposing surface (surface 120f). The second swing mechanism mounting surface (surface 120g) has a normal parallel to the x axis direction.

One of the first magnet 142 and the first coil 144 of the first swing mechanism 140 is mounted on the first swing mechanism mounting surface (surface 120h). Similarly, one of the second magnet 152 and the second coil 154 of the second swing mechanism 150 is mounted on the second swing mechanism mounting surface (surface 120g). The first swing mechanism 140 and the second swing mechanism 150 are mounted on mounting surfaces (surfaces 120h, 120g) having normals respectively parallel to the x axis direction and the y axis direction, whereby the holder 120 can efficiently swing with respect to the case 130.

Further, as described above, the optical element 110 is located on the optical element mounting surface (surface 120a) of the holder 120. The optical element mounting surface (surface 120a) is located between the first case opposing surface (surface 120e) and the second case opposing surface (surface 120f). Further, the optical element mounting surface (surface 120a) is provided obliquely with respect to the first swing mechanism mounting surface (surface 120h) and the second swing mechanism mounting surface (surface 120g). Therefore, it is possible to effectively prevent the optical axis of the reflected light from being displaced by the optical element 110 attached to the optical element mounting surface (surface 120a).

As described above, the first protrusion 125 of the holder 120 is housed in the first recess 135 of the case 130, and the second protrusion 126 of the holder 120 is housed in the second recess 136 of the case 130.

Figure 5A:
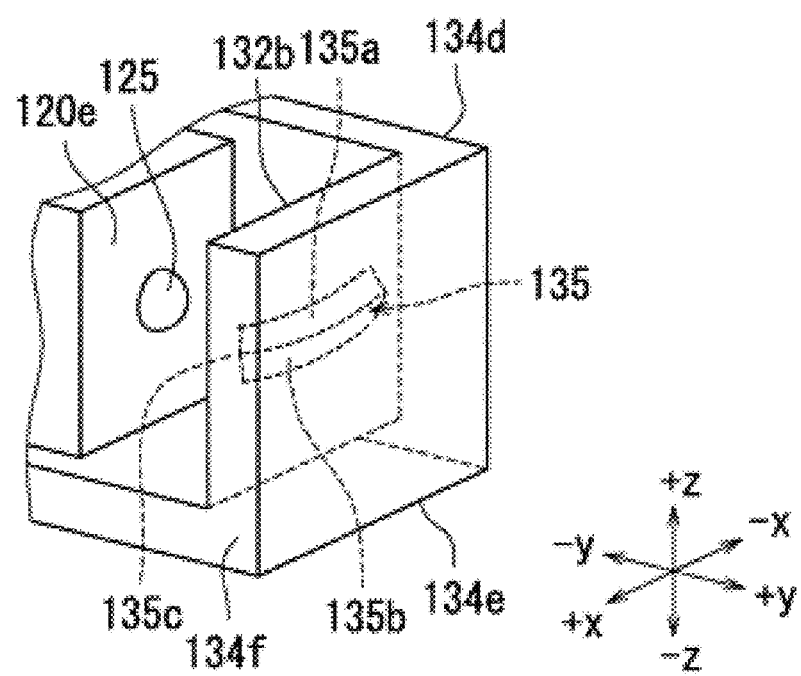
FIG. 5A is a schematic diagram describing a contact between a first protrusion of the holder and a first recess of the case in the optical assembly according to the first example embodiment.

Here, the contact between the protrusions of the holder 120 and the recesses of the case 130 in the optical assembly 100 according to the present example embodiment will be described with reference to FIGS. 5A and 5B. First, the contact between the first protrusion 125 of the holder 120 and the first recess 135 of the case 130 in the optical assembly 100 will be described. FIG. 5A is a schematic view for describing the contact between the first protrusion 125 of the holder 120 and the first recess 135 of the case 130 in the optical assembly 100 according to the present example embodiment.

As shown in FIG. 5A, the first protrusion 125 protrudes from the surface 120e of the holder 120. The first protrusion 125 partially has a spherical shape. Here, the first protrusion 125 has a hemispherical shape. However, the first protrusion 125 may not have a hemispherical shape. The first protrusion 125 preferably has a curved surface. In one example, the first protrusion 125 may have rounded corners around a rectangular flat surface.

As described above, the first recess 135 houses at least a portion of the first protrusion 125. The first recess 135 has a first side surface 135a and a second side surface 135b. The first side surface 135a is located on one side in the z axis direction with respect to the first protrusion 125. The second side surface 135b is located on the other side in the z axis direction with respect to the first protrusion 125. The first side surface 135a of the first recess 135 and the second side surface 135b of the first recess 135 are connected by a connection portion 135c. Here, "connection" simply indicates a connected state. Therefore, a connecting operation is not required in the manufacturing process. In addition, the first side surface 135a and the second side surface 135b may be connected without a distinct border between them.

Here, the first side surface 135a is inclined downward from the first holder opposing surface (132b) from one side in the z axis direction toward the connection portion 135c with a constant inclination. That is, the first side surface 135a is inclined from one side toward the other side in the z axis direction. Further, the second side surface 135b is inclined upward from the first holder opposing surface (132b) from the other side in the z axis direction toward the connection portion 135c with a constant inclination. That is, the second side surface 135b is inclined from the other side toward one side in the z axis direction. The first side surface 135a and the second side surface 135b are symmetrical with respect to a plane (xy plane) perpendicular to the z axis.

Further, when viewed from front in the z axis direction, the connection portion 135c has a curved surface shape. Here, the curved surface shape of the connection portion 135c may be an arc shape, and defined by a constant radius of curvature. Therefore, the depth of the connection portion 135c (the distance from the surface 132b to the connection portion 135c) varies according to the position in the x direction. The connection portion 135c is the deepest in the center of the first side surface 135a in the x direction.

In FIG. 5A, the ends of the first side surface 135a and the second side surface 135b are directly connected to each other. That is, the connection portion 135c has only the minimum necessary width for manufacture. However, the present example embodiment is not limited thereto. The connection portion 135c may have a surface extending in the z axis direction. In this case, the inclination of the first side surface 135a and the second side surface 135b in the z axis direction can be set smaller than that in the configuration in which the ends of the first side surface 135a and the second side surface 135b are directly connected to each other. As a result, the first protrusion 125 can be easily housed in the first recess 135. Therefore, the holder 120 can be easily attached to the case 130.

Next, the contact between the second protrusion 126 of the holder 120 and the second recess 136 of the case 130 in the optical assembly 100 will be described. FIG. 5B is a schematic view for describing the contact between the second protrusion 126 of the holder 120 and the second recess 136 of the case 130 in the optical assembly 100 according to the present example embodiment.

Figure 5B:
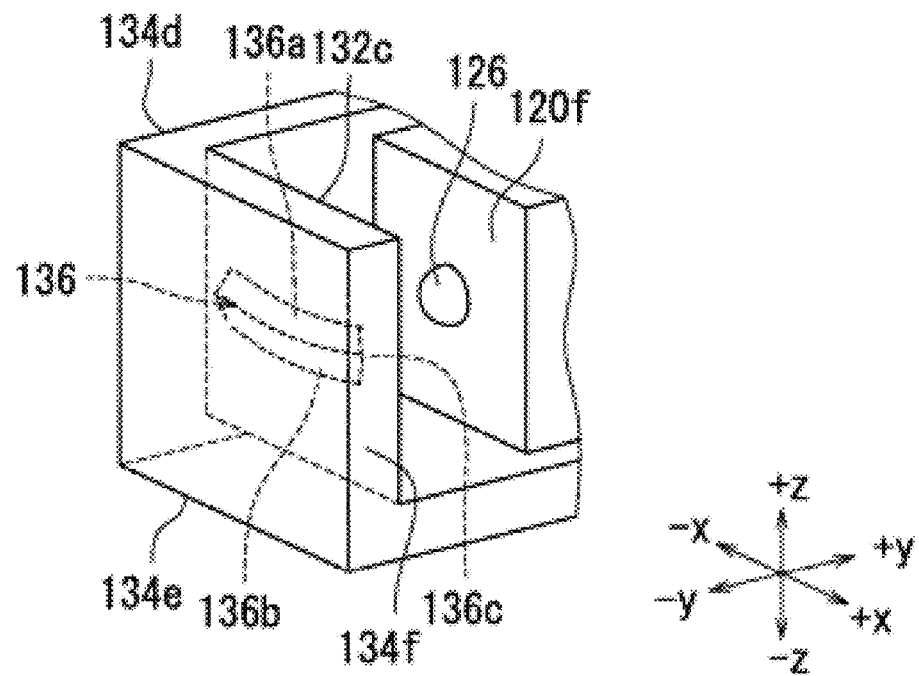
FIG. 5B is a schematic diagram describing a contact between a second protrusion of the holder and a second recess of the case in the optical assembly according to the first example embodiment.

As shown in FIG. 5B, the second protrusion 126 protrudes from the surface 120*f* of the holder 120. The second protrusion 126 partially has a spherical shape. Here, the second protrusion 126 has a hemispherical shape. Here, the second protrusion 126 has a hemispherical shape. However, the second protrusion 126 may not have a hemispherical shape. The second protrusion 126 preferably has a curved surface. In one example, the second protrusion 126 may have rounded corners around a rectangular flat surface.

As described above, the second recess 136 houses at least a portion of the second protrusion 126. The second recess 136 has a first side surface 136*a* and a second side surface 136*b*. The first side surface 136*a* is located on one side in the z axis direction with respect to the second protrusion 126. The second side surface 136*b* is located on the other side in the z axis direction with respect to the second protrusion 126. The first side surface 136*a* of the second recess 136 and the second side surface 136*b* of the second recess 136 are connected by a connection portion 136*c*. As mentioned above, "connection" simply indicates a connected state. Therefore, a connecting operation is not required in the manufacturing process. In addition, the first side surface 136*a* and the second side surface 136*b* may be connected without a distinct border between them.

Here, the first side surface 136*a* is inclined downward from the second holder opposing surface (132*c*) from one side in the z axis direction toward the connection portion 136*c*. Further, the second side surface 136*b* is inclined upward from the first holder opposing surface (132*c*) from the other side in the z axis direction toward the connection portion 136*c*. The first side surface 136*a* and the second side surface 136*b* are symmetrical with respect to a plane (xy plane) perpendicular to the z axis.

Further, when viewed from front in the z axis direction, the connection portion 136*c* has a curved surface shape. Here, the curved surface shape of the connection portion 136*c* may be an arc shape, and defined by a constant radius of curvature. Therefore, the depth of the connection portion 136*c* (the distance from the surface 132*c* to the connection portion 136*c*) varies according to the position in the x direction. In the exemplary example embodiment of the present disclosure, the connection portion 136*c* is the deepest in the center of the first side surface 136*a* in the x direction.

In FIG. 5B, the ends of the first side surface 136*a* and the second side surface 136*b* are directly connected to each other. That is, the connection portion 136*c* has only the minimum necessary width for manufacture. However, the present example embodiment is not limited thereto. The connection portion 136*c* may have a surface extending in the z axis direction. In this case, the inclination of the first side surface 136*a* and the second side surface 136*b* in the z axis direction can be set smaller than that in the configuration in which the ends of the first side surface 136*a* and the second side surface 136*b* are directly connected to each other. As a result, the second protrusion 126 can be easily housed in the second recess 136. Therefore, the holder 120 can be easily attached to the case 130.

As can be seen from FIGS. 5A and 5B, the first recess 135 supports the first protrusion 125, and each of the first side surface 135*a* and the second side surface 135*b* is in contact with the first protrusion 125. At this time, the first protrusion 125 can swing around the y axis and the z axis with respect to the first recess 135, but the swing around the x axis is restricted. Similarly, the second recess 136 supports the second protrusion 126, and each of the first side surface 136*a* and the second side surface 136*b* is in contact with the second protrusion 126. At this time, the second protrusion 126 can swing around the y axis and the z axis with respect to the second recess 136, but the swing around the x axis is restricted.

According to the exemplary example embodiment of the present disclosure, the optical assembly 100 can swing around two (for example, the y axis and the z axis) of three axes which are mutually orthogonal, and restricts the swing around the remaining one axis (for example, the x axis). Accordingly, the deviation of the optical axis of the reflected light can be suppressed with a simple configuration.

Further, as described above, the first protrusion 125 partially has a spherical shape, and similarly, the second protrusion 126 partially has a spherical shape. Therefore, the optical assembly 100 can swing smoothly around the y axis and the z axis.

Figure 6A:
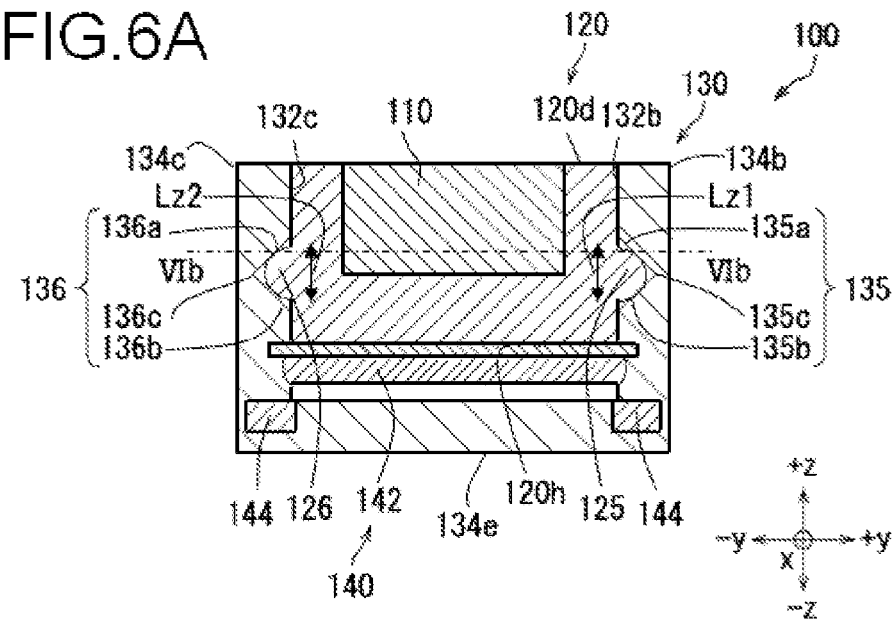
FIG. 6A is a sectional view taken along line VIa-VIa in FIG. 2A.
Figure 6B:
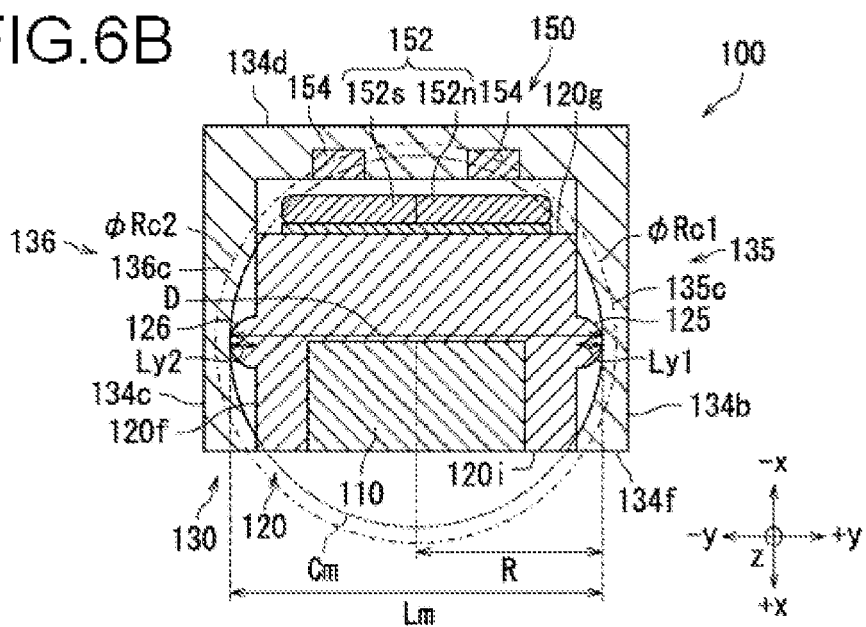
FIG. 6B is a sectional view taken along line VIb-VIb in FIG. 2A or FIG. 6A.

Next, the configuration in which the protrusions of the holder 120 are in contact with the recesses of the case 130 in the optical assembly 100 according to the present example embodiment will be described with reference to FIGS. 6A to 6E. First, the configuration in which the first protrusion 125 and the second protrusion 126 of the holder 120 are in contact with the first recess 135 and the second recess 136 of the case 130, respectively, in the optical assembly 100 according to the present example embodiment will be described with reference to FIG. 6A. FIG. 6A is a sectional view taken along line VIa-VIa in FIG. 2A, and FIG. 6B is a sectional view taken along line VIb-VIb in FIGS. 2A and 6A. FIGS. 6C to 6E are sectional views taken along line VIa-VIa in modifications.

As shown in FIG. 6A, the first protrusion 125 is housed in the first recess 135, and the second protrusion 126 is housed in the second recess 136.

Here, the position of the second recess 136 in the surface 132*c* of the case 130 is substantially equal to the position of the first recess 135 in the surface 132*b* of the case 130.

The connection portion 135*c* of the first recess 135 extends in the circumferential direction about the second swing axis. In the entire length of the connection portion 135*c*, the length Lz1 of the first protrusion 125 along the z axis direction is longer than the length of the connection portion 135*c* along the z axis direction. Therefore, in the radial direction around the second swing axis, the first protrusion 125 is in point contact with the first side surface 135*a* at a position inside the connection portion 135*c*. The point where the first protrusion 125 and the first side surface 135*a* are in point contact with each other is on one side in the z axis direction with respect to the first protrusion 125. Similarly, in the radial direction around the second swing axis, the first protrusion 125 is in point contact with the second side surface 135*b* at a position inside the connection portion 135*c*. The point where the first protrusion 125 and the second side surface 135*b* are in point contact with each other is on the other side in the z axis direction with respect to the first protrusion 125. That is, the first protrusion 125 is supported by the first recess 135 from both sides in the z axis direction with the point on the first side surface 135*a* and the point on the second side surface 135*b* as supporting points.

Similarly, the connection portion 136*c* of the second recess 136 extends in the circumferential direction around the second swing axis. In the entire length of the connection portion 136c, the length Lz2 of the second protrusion 126 along the z axis direction is longer than the length of the connection portion 136c along the z axis direction. Therefore, in the radial direction around the second swing axis, the second protrusion 126 is in point contact with the first side surface 136a at a position inside the connection portion 136c on one side in the z axis direction. Similarly, in the radial direction around the second swing axis, the second protrusion 126 is in point contact with the second side surface 136b at a position inside the connection portion 136c on the other side in the z axis direction. That is, the second protrusion 126 is supported by the second recess 136 from both sides in the z axis direction with the point on the first side surface 136a and the point on the second side surface 136b as supporting points.

The first protrusion 125 and the second protrusion 126 can swing around the y axis. Here, since the first protrusion 125 and the second protrusion 126 are both hemispherical in shape, the holder 120 can smoothly rotate around the y axis together with the first protrusion 125 and the second protrusion 126.

On the other hand, the first protrusion 125 is supported by the first recess 135 from both sides in the z axis direction with the point on the first side surface 135a and the point on the second side surface 135b as supporting points. Further, the second protrusion 126 is supported by the second recess 136 from both sides in the z axis direction with the point on the first side surface 136a and the point on the second side surface 136b as supporting points. Therefore, the swing of the holder 120 around the x axis is restricted. Even if the holder 120 receives a force for allowing the holder 120 to swing in the clockwise direction based on the x axis, the swing of the holder 120 in the clockwise direction is restricted, because the first protrusion 125 is in contact with the second side surface 135b of the first recess 135, and the second protrusion 126 is in contact with the first side surface 136a of the second recess 136. Similarly, even if the holder 120 receives a force for allowing the holder 120 to swing in the counterclockwise direction based on the x axis, the swing of the holder 120 in the counterclockwise direction is restricted, because the first protrusion 125 is in contact with the first side surface 135a of the first recess 135, and the second protrusion 126 is in contact with the second side surface 136b of the second recess 136.

Further, as shown in FIG. 6B, the first protrusion 125 is housed in the first recess 135, and the second protrusion 126 is housed in the second recess 136.

The connection portion 135c of the first recess 135 has an arc shape. When a circle is formed which has a diameter equal to the length Lm of a straight line D connecting the end of the first protrusion 125 and the end of the second protrusion 126 with the midpoint of the straight line D defined as the center of the circle, the radius of curvature φRc1 of the connection portion 135c is greater than the radius R (length Lm/2) of the circle. Here, the length Lm of the straight line D is equal to the sum of the length of the holder 120 along the y direction, the length Ly1 of the first protrusion 125, and the length Ly2 of the second protrusion 126. Note that, in a case where the first protrusion 125 has a hemispherical shape, the length Ly1 is substantially equal to a half of the length Lz1. In the radial direction around the second swing axis, the first protrusion 125 is in point contact with the first side surface 135a at a position inside the connection portion 135c. The point where the first protrusion 125 and the first side surface 135a are in point contact with each other is on one side in the z axis direction with respect to the first protrusion 125. Similarly, in the radial direction around the second swing axis, the first protrusion 125 is in point contact with the second side surface 135b at a position inside the connection portion 135c. The point where the first protrusion 125 and the second side surface 135b are in point contact with each other is on the other side in the z axis direction with respect to the first protrusion 125 (not shown). That is, the first protrusion 125 is supported by the first recess 135 from both sides in the z axis direction with the point on the first side surface 135a and the point on the second side surface 135b as supporting points.

Similarly, the connection portion 136c of the second recess 136 has an arc shape. When the circle is formed which has a diameter equal to the length Lm of the straight line D with the midpoint of the straight line D defined as the center of the circle, the radius of curvature φRc2 of the connection portion 136c is greater than the radius R (length Lm/2) of the circle. In the radial direction around the second swing axis, the second protrusion 126 is in point contact with the first side surface 136a at a position inside the connection portion 136c on one side in the z axis direction. Similarly, in the radial direction, the second protrusion 126 is in point contact with the second side surface 136b at a position inside the connection portion 136c on the other side in the z axis direction (not shown). That is, the second protrusion 126 is supported by the second recess 136 from both sides in the z axis direction with the point on the first side surface 136a and the point on the second side surface 136b as supporting points.

Here, the radius of curvature φRc1 and the radius of curvature φRc2 are greater than the radius R based on the straight line D that connects the end of the first protrusion 125 and the end of the second protrusion 126. Further, the connection portion 135c of the first recess 135 and the connection portion 136c of the second recess 136 constitute a part of the same circle Cm. Therefore, the holder 120 can swing smoothly around the z axis together with the first protrusion 125 and the second protrusion 126.

Further, the cross-sectional shape of the first recess 135 or the second recess 136 along line VIa-VIa is not limited to the shape shown in FIG. 6A. It is only sufficient that each of the first recess 135 and the second recess 136 includes an inclined surface. For example, the first recess 135 may include an inclined surface in which the distance between the first side surface 135a and the second side surface 135b in the second swing axis direction increases toward the outside in the radial direction around the second swing axis.

It is desirable, however, that the first recess 135 includes an inclined surface in which the distance between the first side surface 135a and the second side surface 135b in the second swing axis direction decreases toward the outside in the radial direction around the second swing axis. With this configuration, the first recess 135 can stably support the first protrusion 125. In particular, when both the first side surface 135a and the second side surface 135b include such an inclined surface, the first recess 135 can more stably support the first protrusion 125. Similarly, it is desirable that the second recess 136 also includes an inclined surface in which the distance between the first side surface 136a and the second side surface 136b in the second swing axis direction decreases. With this configuration, the second recess 136 can stably support the second protrusion 126. In particular, when both the first side surface 136a and the second side surface 136b include such an inclined surface, the second recess 136 can more stably support the second protrusion 126.

As shown in FIG. 6C, the connection portion 135c of the first recess 135 may extend in the z axis direction. In this case, the first side surface 135a and the second side surface 135b are gently inclined with respect to the z axis direction, as compared with the configuration in which the connection portion 135c does not have a surface extending in the z axis direction. Therefore, the first protrusion 125 can be easily housed in the first recess 135. The same applies to the second recess 136.

That is, the first side surface 135a and the second side surface 135b of the first recess 135 may be connected by a surface extending in the direction of the second swing axis, and the first side surface 136a and the second side surface 136b of the second recess 136 may be connected by a surface extending in the direction of the second swing axis. This configuration facilitates the attachment of the holder 120 to the case 130.

As shown in FIG. 6D, in the cross-sectional shape of the first recess 135 along line VIa-VIa, the first side surface 135a or the second side surface 135b may include a curved surface. In addition, the cross-sectional shape may be a part of a circle or ellipse, and the distinct border may not be formed between the first side surface 135a and the second side surface 135b. The same applies to the second recess 136.

On the other hand, if the first side surface 135a or the second side surface 135b has a straight line having a constant inclination in the cross-sectional shape of the first recess 135 along line VIa-VIa, the width of the first recess 135 can be varied with a constant degree toward the outside in the radial direction around the second swing axis. The same applies to the second recess 136.

That is, at least one of the first side surface 135a and the second side surface 135b of the first recess 135 may be connected to the other at a constant inclination, and at least one of the first side surface 136a and the second side surface 136b of the second recess 136 may be connected to the other at a constant inclination, when viewed in the circumferential direction around the second swing axis. In this case, the width of the first recess 135 and the second recess 136 can be varied with a constant degree toward the outside in the radial direction around the second swing axis.

Accordingly, even if there is a manufacturing error in the first protrusion 125 or the first recess 135, the contact position between the first protrusion 125 and the first recess 135 can be adjusted according to the error. The same applies to the second protrusion 126 and the second recess 136. Therefore, the case 130 can stably support the holder 120.

As shown in FIG. 6E, the second side surface 135b of the first recess 135 and the second side surface 136b of the second recess 136 may extend in a direction parallel to the y axis. Similarly, if the second side surface 135b of the first recess 135 and the second side surface 136b of the second recess 136 have an inclined surface, the first side surface 135a of the first recess 135 and the first side surface 136a of the second recess 136 may extend in the direction parallel to the y axis.

That is, the other of the first side surface and the second side surface of the first recess may be a surface parallel to the second axis direction, and the other of the first side surface and the second side surface of the second recess may be a surface parallel to the second axis direction. In this case, the first recess 135 easily houses the first protrusion 125, and the second recess 136 easily houses the second protrusion 126. Therefore, the holder 120 can be more easily attached to the case 130.

On the other hand, when the first side surface 135a and the second side surface 135b are line-symmetric with respect to the second axis direction in the cross-sectional shape of the first recess 135 along VIa-VIa line, the first protrusion 125 can be supported by two equidistant points in the radial direction around the second swing axis. The same applies to the second protrusion 126.

That is, the first side surface 135a and the second side surface 135b of the first recess 135 may be symmetrical with respect to a plane perpendicular to the second swing axis, and the first side surface 136a and the second side surface 136b of the second recess 136 may be symmetrical with respect to the plane perpendicular to the second swing axis. In this case, the two contact points of the first protrusion 125 and the first recess 135 are aligned in parallel in the second swing axis direction. The same applies to the two contact points between the second protrusion 126 and the second recess 136.

Accordingly, the first protrusion can be supported by two equidistant points in the radial direction based on the second swing axis. Therefore, it is possible to stabilize the operation during swing.

Figure 7A:
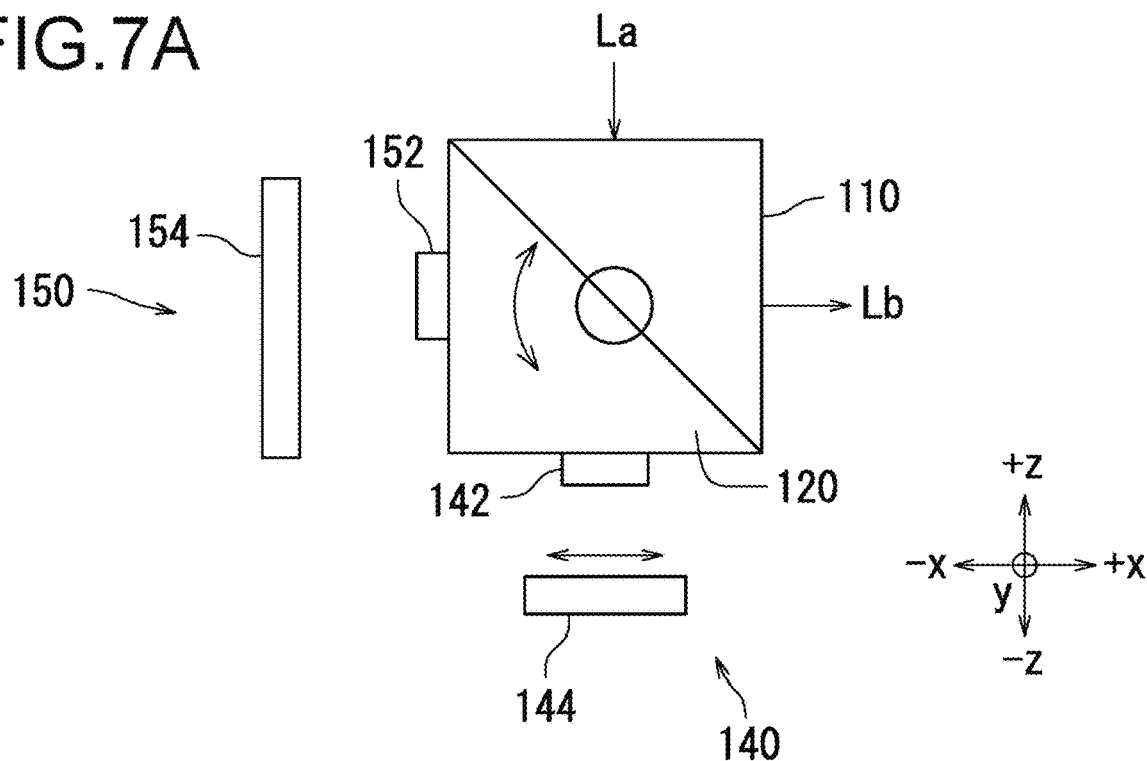
FIG. 7A is a schematic diagram describing a swing of the optical assembly according to the first example embodiment by the first swing mechanism.

Next, the swing of the optical assembly 100 according to the present example embodiment will be described with reference to FIGS. 7A and 7B. FIG. 7A is a schematic diagram for describing the swing of the optical assembly 100 according to the present example embodiment by the first swing mechanism 140, and FIG. 7B is a schematic diagram for describing the swing of the optical assembly 100 according to the present example embodiment by the second swing mechanism 150.

As shown in FIG. 7A, the first swing mechanism 140 includes the first magnet 142 and the first coil 144. The first magnet 142 is provided to the holder 120, and the first coil 144 is provided to the case 130. Further, the second swing mechanism 150 includes the second magnet 152 and the second coil 154. The second magnet 152 is provided to the holder 120, and the second coil 154 is provided to the case 130.

By switching the direction of a current flowing through the first coil 144, the first magnet 142 receives a force along the x axis direction. In this case, the first magnet 142 moves along the x axis direction. Therefore, the holder 120 to which the first magnet 142 is attached swings around the y axis with respect to the case 130.

Figure 7B:
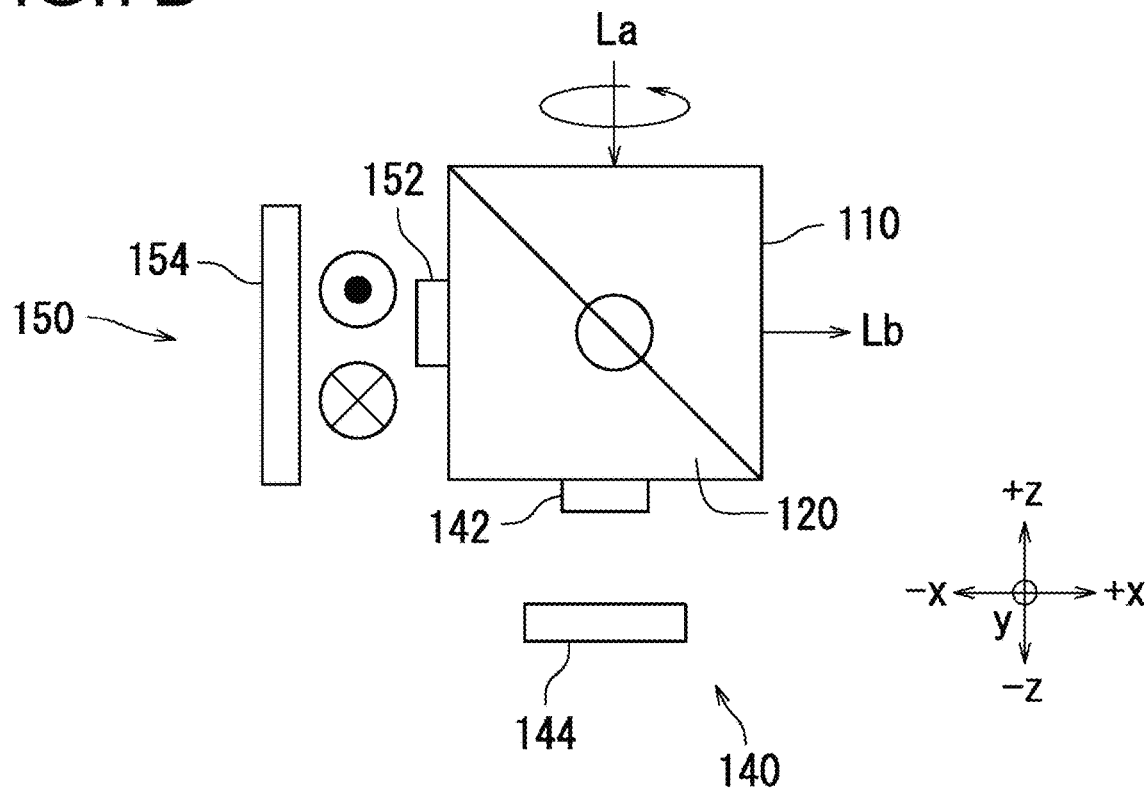
FIG. 7B is a schematic diagram describing a swing of the optical assembly according to the first example embodiment by the second swing mechanism.

As shown in FIG. 7B, the second magnet 152 receives a force along the y axis direction by switching the direction of the current flowing through the second coil 154. In this case, the second magnet 152 moves along the y axis direction. Therefore, the holder 120 to which the second magnet 152 is attached swings around the z axis with respect to the case 130.

Figure 8A:
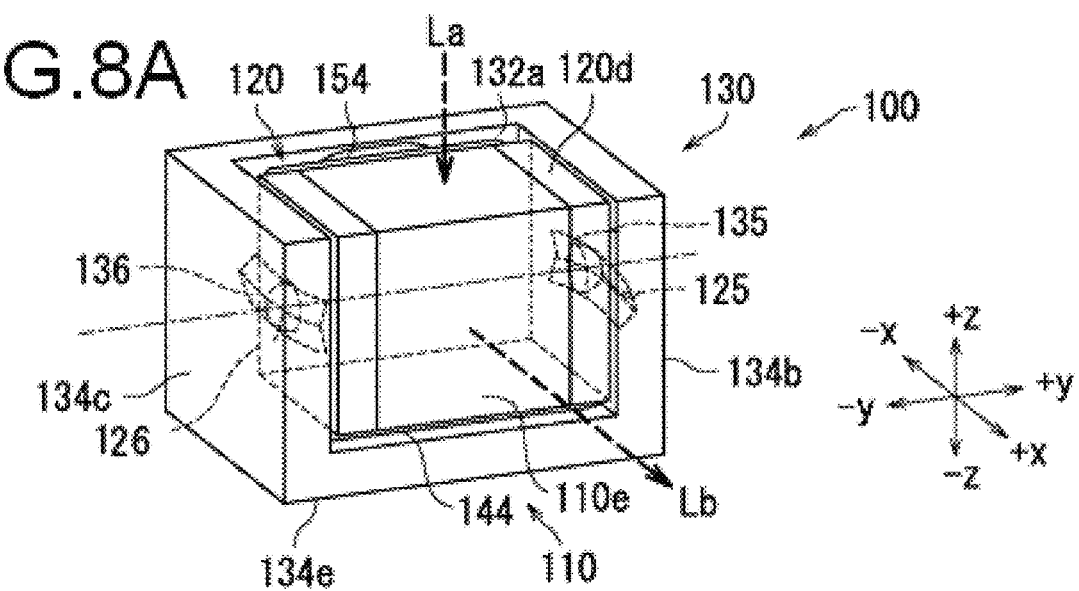
FIGS. 8A to 8C are schematic diagrams describing the swing of the optical assembly according to the first example embodiment by the first swing mechanism.
Figure 8B:
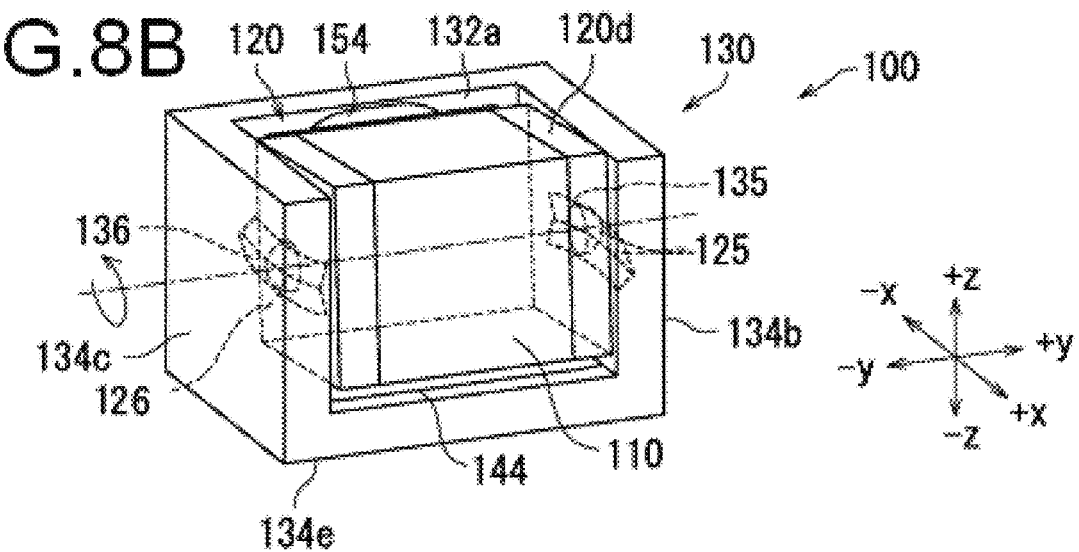
Figure 8C:
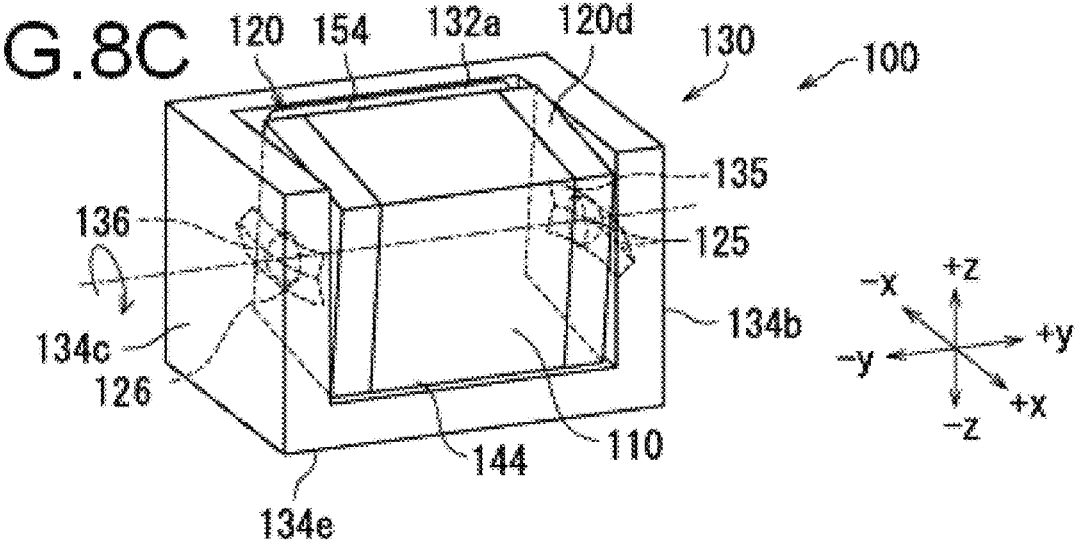

Next, the swing of the optical assembly 100 according to the present example embodiment by the first swing mechanism 140 will be described with reference to FIGS. 8A to 8C. FIGS. 8A to 8C are schematic diagrams for describing the swing of the optical assembly 100 according to the present example embodiment by the first swing mechanism 140. In FIG. 8A, the holder 120 in the optical assembly 100 is located at a reference position, and in FIGS. 8B and 8C, the holder 120 swings in either direction with respect to the reference position.

As shown in FIG. 8A, when the holder 120 is in the reference position with respect to the case 130, the normal of the surface 110e of the optical element 110 is oriented in the x axis direction, and the reflected light Lb travels along the x axis direction.

As shown in FIG. 8B, when a clockwise swing based on the +y axis direction occurs with respect to the case 130, the holder 120 can swing counterclockwise based on the +y axis direction with respect to the case 130. Further, as shown in FIG. 8C, when a counterclockwise swing based on the +y axis direction occurs with respect to the case 130, the holder 120 can swing clockwise based on the +y axis direction with respect to the case 130.

Figure 9A:
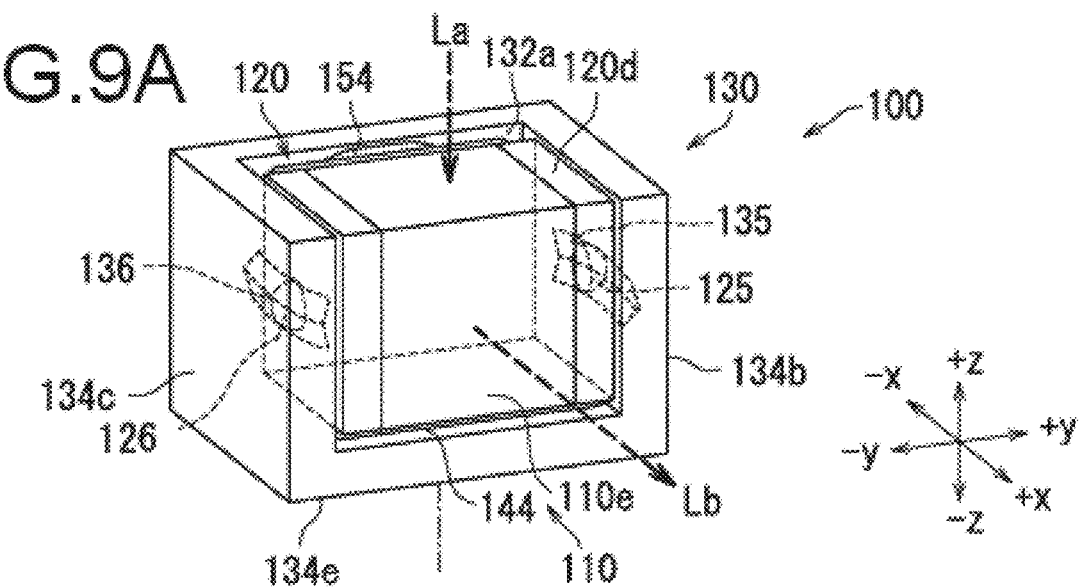
FIGS. 9A to 9C are schematic diagrams describing the swing of the optical assembly according to the first example embodiment by the second swing mechanism.
Figure 9B:
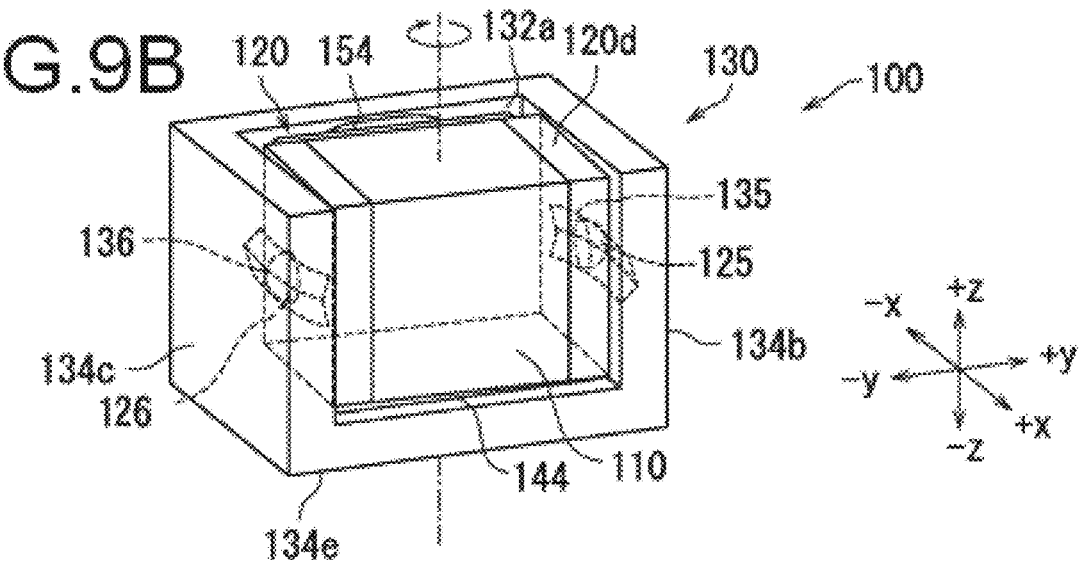
Figure 9C:
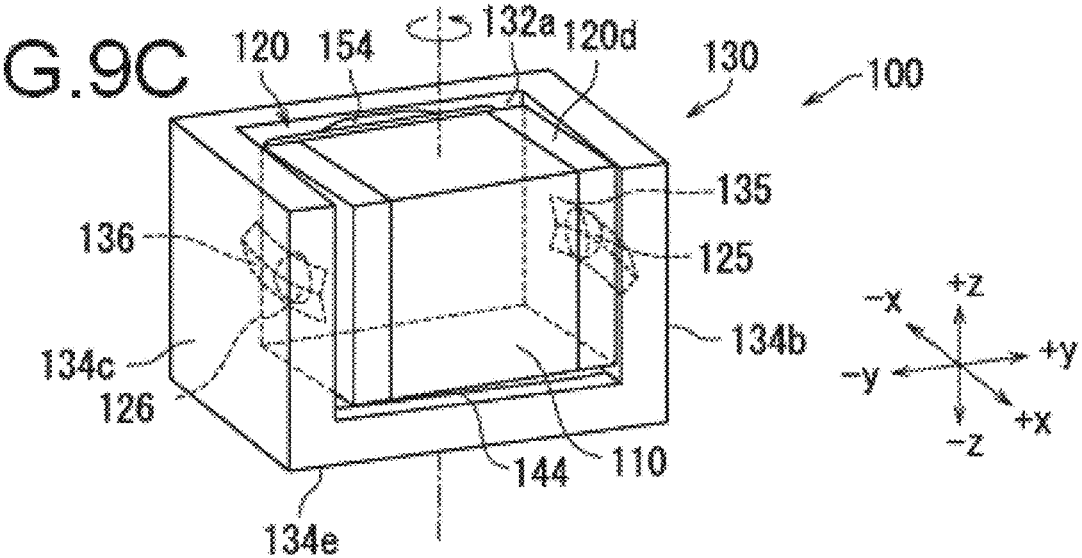

Next, the swing of the optical assembly 100 according to the present example embodiment by the second swing mechanism 150 will be described with reference to FIGS. 9A to 9C. FIGS. 9A to 9C are schematic diagrams for describing the swing of the optical assembly 100 according to the present example embodiment by the second swing mechanism 150. In FIG. 9A, the holder 120 in the optical assembly 100 is located at the reference position, and in FIGS. 9B and 9C, the holder 120 swings in either direction with respect to the reference position.

As shown in FIG. 9A, when the holder 120 is in the reference position with respect to the case 130, the normal of the surface 110*e* of the optical element 110 is oriented in the x axis direction, and the reflected light Lb travels along the x axis direction.

As shown in FIG. 9B, when a counterclockwise swing based on the −z axis direction occurs with respect to the case 130, the holder 120 can swing clockwise based on the −z axis direction with respect to the case 130. Further, as shown in FIG. 9C, when a clockwise swing based on the −z axis direction occurs with respect to the case 130, the holder 120 can swing counterclockwise based on the −z axis direction with respect to the case 130.

When the case 130 is made of resin, the resin is typically formed by integral molding. In this case, the case 130 may be composed of one component. However, the case 130 may be composed of a plurality of components. For example, if the case 130 is composed of a plurality of components, the components of the case 130 may be assembled after the holder 120 is attached.

In the abovementioned optical assembly 100, the first protrusion 125 and the second protrusion 126 each have a hemispherical shape, but the present example embodiment is not limited thereto. Each of the first protrusion 125 and the second protrusion 126 may have a cylindrical base part with its tip being hemispherical.

Further, in the abovementioned optical assembly 100, the holder 120 is supported so as to be swingable with respect to the case 130, so that the reference position of the holder 120 with respect to the case 130 may not be fixed. However, it is preferable that the reference position of the holder 120 with respect to the case 130 is fixed.

Figure 10:
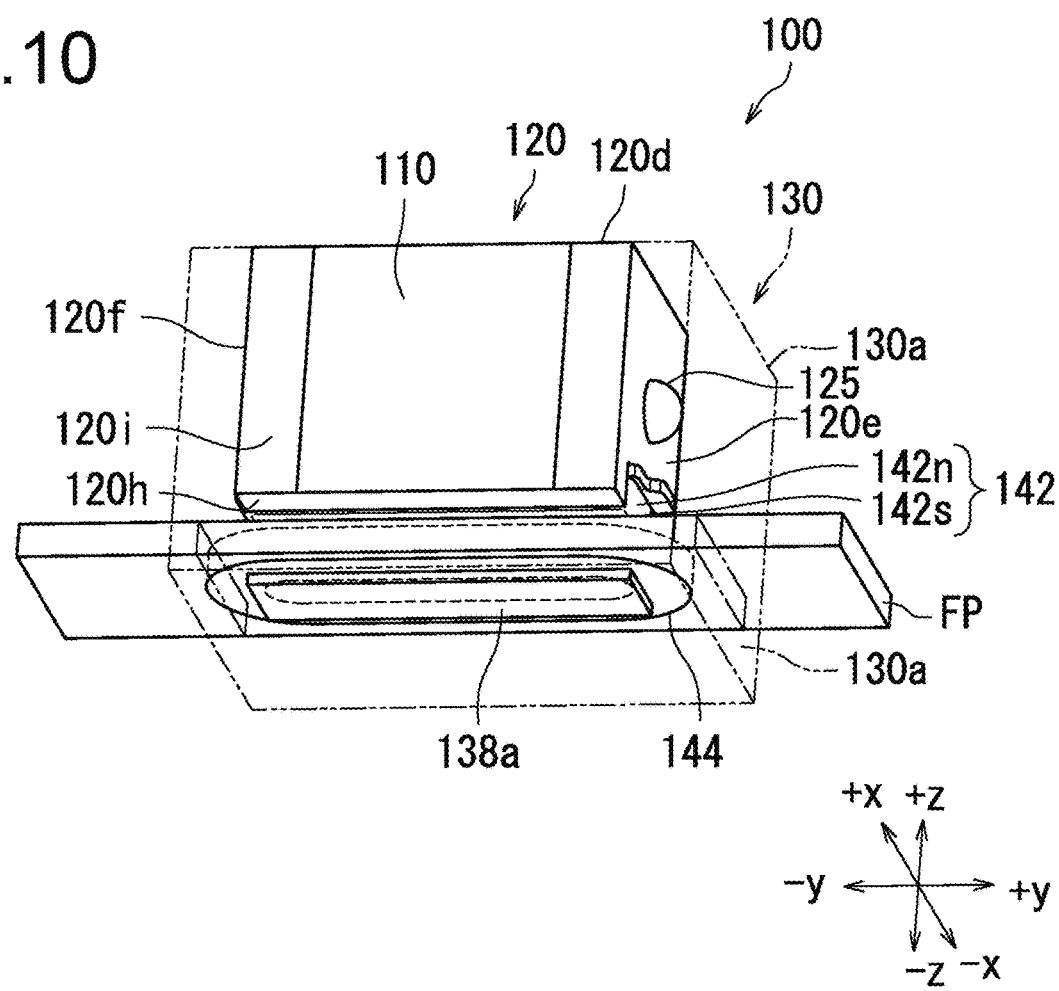
FIG. 10 is a schematic perspective view of the optical assembly according to the first example embodiment.

Next, the optical assembly 100 according to the present example embodiment will be described with reference to FIG. 10. FIG. 10 is a schematic perspective view of the optical assembly 100 according to the present example embodiment. The optical assembly 100 in FIG. 10 has the same configuration as the optical assembly 100 shown in FIGS. 2A and 2B except that the case 130 has a case body 130*a* and a metal member 138*a*, and a flexible printed circuit board (FPC) is inserted into the case 130. In order to avoid redundancy, redundant description will be omitted. In FIG. 10, the contour of the case 130 is indicated by a dash-dot-dot-dash line in order to avoid excessive complexity of the drawing.

As shown in FIG. 10, in the optical assembly 100, the case 130 has the case body 130*a* and the metal member 138*a*. The metal member 138*a* faces the first magnet 142.

Here, the metal member 138*a* is provided inside the case body 130*a*. Further, the metal member 138*a* is provided in the vicinity of the first coil 144 located inside the case body 130*a*. When a current does not flow through the first coil 144, the first magnet 142 and the holder 120 provided with the first magnet 142 can be positioned at a predetermined position due to the metal member 138*a*. By providing the metal member 138*a* with respect to the first swing mechanism 140, the position of the holder 120 with respect to the case 130 when no current flows through the first coil 144 can be defined. Note that the magnetic force generated between the metal member 138*a* and the first magnet 142 is lower than the magnetic force generated when a current flows through the first coil 144. Therefore, even if the metal member 138*a* is provided, the holder 120 swings with respect to the case 130 when a current flows through the first coil 144.

In FIG. 10, the metal member 138*a* is provided in the vicinity of the first coil 144 of the first swing mechanism 140, but the present example embodiment is not limited thereto. The metal member 138*a* may be provided so as to face the second magnet 152 and in the vicinity of the second coil 154 of the second swing mechanism 150.

The metal member 138*a* is preferably arranged symmetrically with respect to the center of the first coil 144. In FIG. 10, the metal member 138*a* extends in the y direction like the N pole 142*n* and the S pole 142*s* of the first magnet 142, and the center of the metal member 138*a* along the x direction is located between the N pole 142*n* and S pole 142*s*. In this case, since the first magnet 142 is attracted to the metal member 138*a* arranged symmetrically with respect to the center of the first coil 144, the position of the holder 120 with respect to the case 130 can be appropriately controlled. Similarly, the metal member 138*a* is preferably arranged symmetrically with respect to the center of the second coil 154. With this configuration, the second magnet 152 is attracted to the metal member 138*a* arranged symmetrically with respect to the center of the second coil 154, so that the position of the holder 120 with respect to the case 130 can be appropriately controlled.

Further, in FIG. 10, the flexible printed circuit board FP is inserted into the case 130. The first coil 144 and the metal member 138*a* are mounted on the flexible printed circuit board FP. By inserting the flexible printed circuit board FP into the case 130, the first coil 144 and the metal member 138*a* can be disposed at predetermined positions with respect to the first magnet 142 of the holder 120. Note that the first coil 144 is preferably provided inside the flexible printed circuit board FP. On the other hand, the metal member 138*a* may be provided inside the flexible printed circuit board FP, or may be provided on the outer surface (for example, the outer surface on the side in the −z axis direction) of the flexible printed circuit board FP.

In a case where the optical assembly 100 is used for a smartphone as shown in FIG. 1, a gyro sensor in the smartphone detects the orientation of the smartphone, and the first swing mechanism 140 and the second swing mechanism 150 are controlled according to the orientation of the smartphone. On the other hand, it is preferable that the orientation of the holder 120 with respect to the case 130 can be detected. With this configuration, the orientation of the holder 120 with respect to the case 130 can be controlled with high accuracy.

Figure 11:
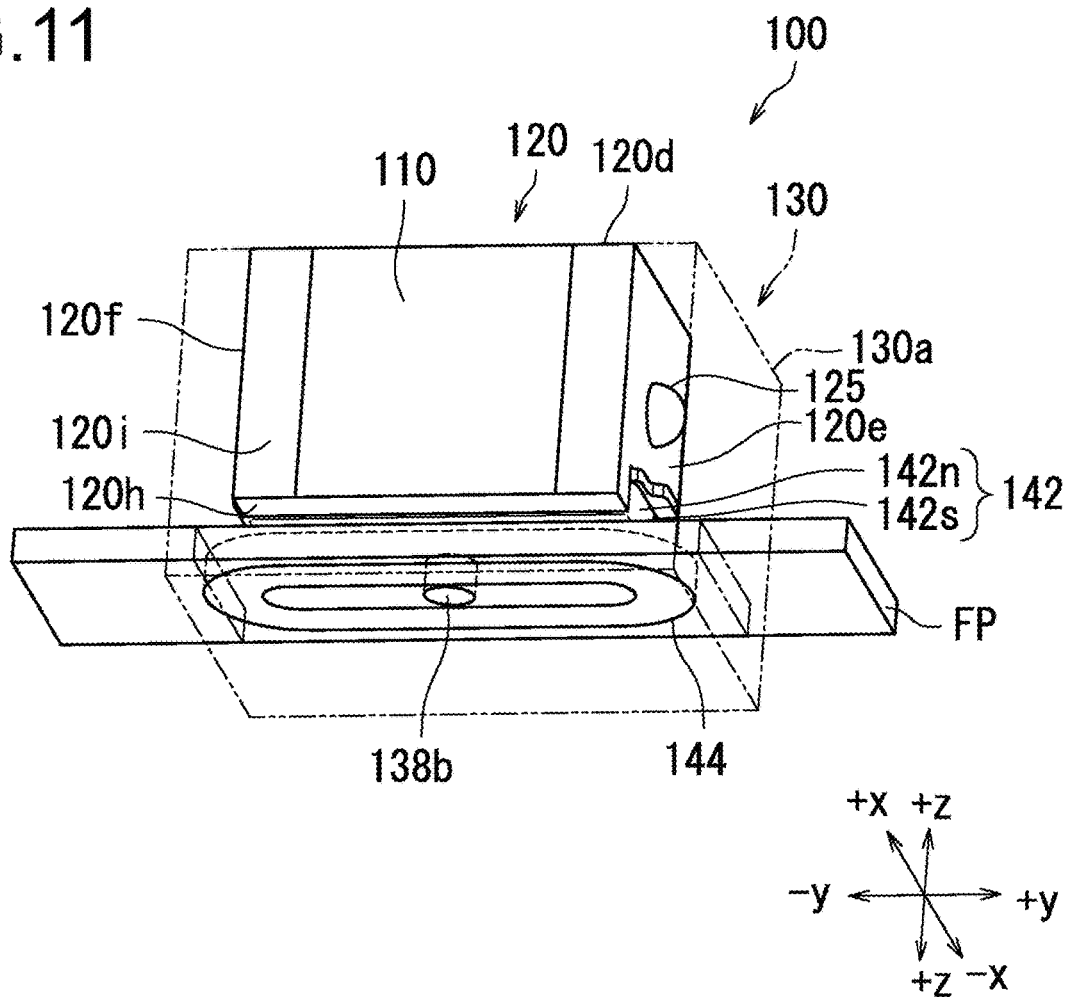
FIG. 11 is a schematic perspective view of the optical assembly according to the first example embodiment.

Next, the optical assembly 100 according to the present example embodiment will be described with reference to FIG. 11. FIG. 11 is a schematic perspective view of the optical assembly 100 according to the present example embodiment. The optical assembly 100 in FIG. 11 has the same configuration as the optical assembly 100 shown in FIG. 10 except that the case 130 has a Hall element 138*b* instead of the metal member 138*a*. In order to avoid redundancy, redundant description will be omitted. In FIG. 11, the contour of the case 130 is also indicated by a dash-dot-dot-dash line in order to avoid excessive complexity of the drawing.

As shown in FIG. 11, in the optical assembly 100, the case 130 has a case body 130a and a Hall element 138b. Here, the Hall element 138b is disposed inside the case body 130a. Further, the Hall element 138b is disposed near the center of the first coil 144 located inside the case body 130a. The position of the holder 120 with respect to the case 130 can be acquired by the Hall element 138b.

In FIG. 11, the Hall element 138b is disposed in the vicinity of the first coil 144 of the first swing mechanism 140, but the present example embodiment is not limited thereto. The Hall element 138b may be disposed in the vicinity of the second coil 154 of the second swing mechanism 150.

The Hall element 138b is preferably located at the center of the first coil 144. With this configuration, the Hall element 138b can appropriately detect the magnetic force from the first magnet 142. Similarly, the Hall element 138b is preferably located at the center of the second coil 154. With this configuration, the Hall element 138b can appropriately detect the magnetic force from the second magnet 152.

The optical assembly 100 shown in FIG. 10 has the metal member 138a, and the optical assembly 100 shown in FIG. 11 has the Hall element 138b. However, it is obvious that the optical assembly 100 may have both the metal member 138a and the Hall element 138b.

In the above description, the first swing mechanism 140 has the first magnet 142 and the first coil 144, and the second swing mechanism 150 has the second magnet 152 and the second coil 154. However, the present example embodiment is not limited thereto. The first swing mechanism 140 and the second swing mechanism 150 may have different configurations. For example, the first swing mechanism 140 and the second swing mechanism 150 may have a shape-memory alloy.

In the above description, in the optical element 110, the reflection surface 110r is formed on the surface of the prism. However, the present example embodiment is not limited thereto. The optical element 110 may not include a prism, and the reflection surface 110r may not be formed on the surface of the prism. For example, a thin plate-shaped reflective member (for example, a mirror) may be attached to the mounting section 121 of the holder 120 as the optical element 110.

However, the optical element 110 preferably includes a prism. When the optical element 110 includes a prism, an optical path can be reduced. Such an optical assembly 100 is suitably used as an image sensor for a telephoto lens.

In the above description, the optical assembly includes the optical element 110 that changes the path of light by reflection. However, the present example embodiment is not limited thereto. The optical assembly may include an optical element that does not change the path of light.

In the above description, the first protrusion 125 simply protrudes from the surface 120e of the holder 120. However, the present example embodiment is not limited thereto. A preload mechanism for pushing the first protrusion 125 from the surface 120e of the holder 120 toward the first holder opposing surface (132b) may be provided. Similarly, the second protrusion 126 simply protrudes from the surface 120f of the holder 120, but the present example embodiment is not limited thereto. A preload mechanism for pushing the second protrusion 126 from the surface 120f of the holder 120 toward the first holder opposing surface (132c) may be provided.

According to this configuration, the case 130 can support the holder 120 more stably. This makes it possible to prevent the holder 120 from detaching from the case 130 due to, for example, a drop impact.

Here, it is preferable to use an elastic body such as rubber, a leaf spring, a coil spring, or a gel as the preload mechanism.

In this case, the abovementioned elastic body may be interposed between the surface of the holder 120 and the first protrusion 125 or the second protrusion 126 to apply an elastic force, or the abovementioned elastic body may be built in the first protrusion 125 or the second protrusion 126.

In the modification of the first example embodiment according to the present disclosure, the second swing axis is parallel to the incident light Lb (that is, parallel to the x axis direction). The schematic configuration of the modification of the first example embodiment of the present disclosure will be described below. The modification of the first example embodiment is different from the first example embodiment only in the direction in which the first recess 135 and the second recess 136 extend and the configuration regarding the first swing mechanism 140 and the second swing mechanism 150. Therefore, in the following, the same components as those in the first example embodiment will be designated by the same reference numerals and description thereof will be omitted. Only the parts different from those in the first example embodiment will be described.

Figure 12A:
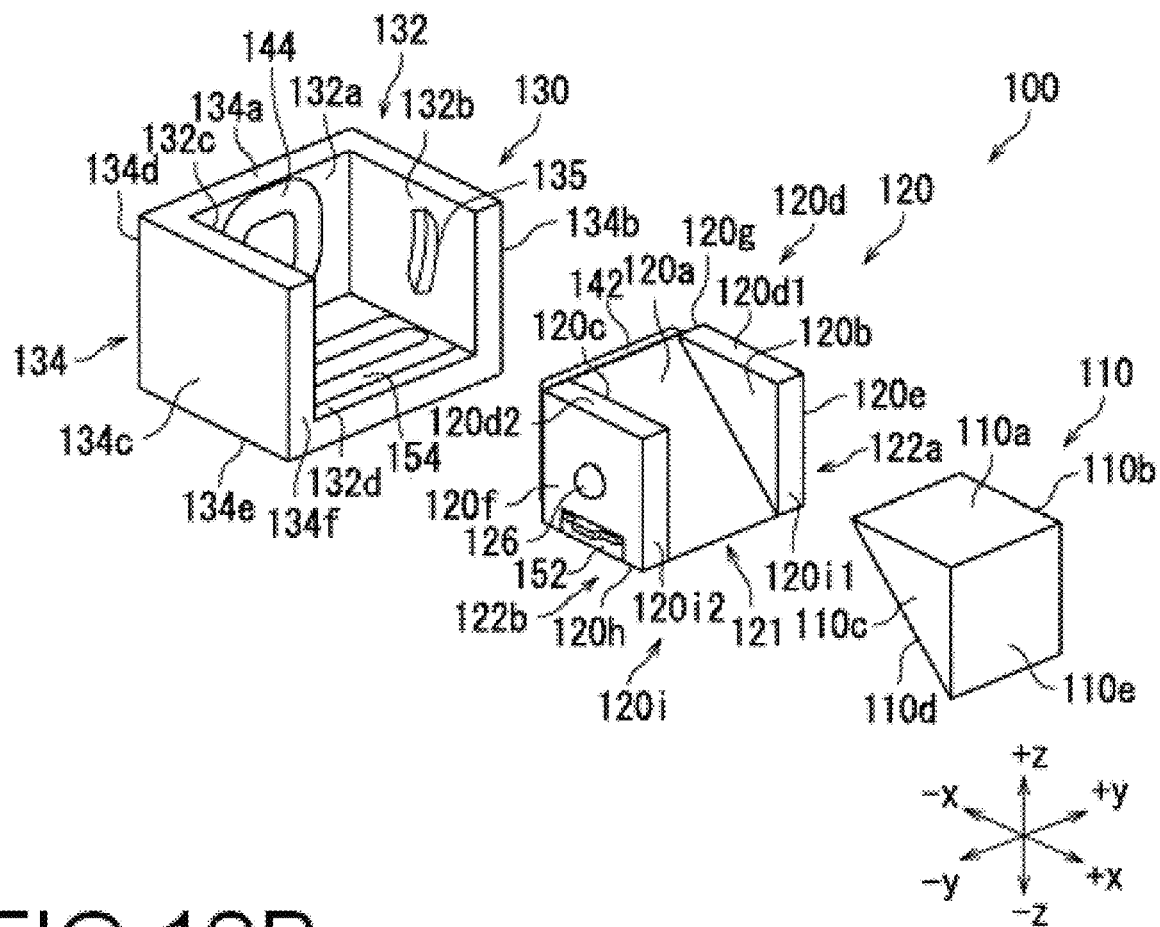
FIGS. 12A and 12B are schematic exploded perspective views of an optical element, a holder, and a case in an optical assembly according to a modification of the first example embodiment.
Figure 12B:
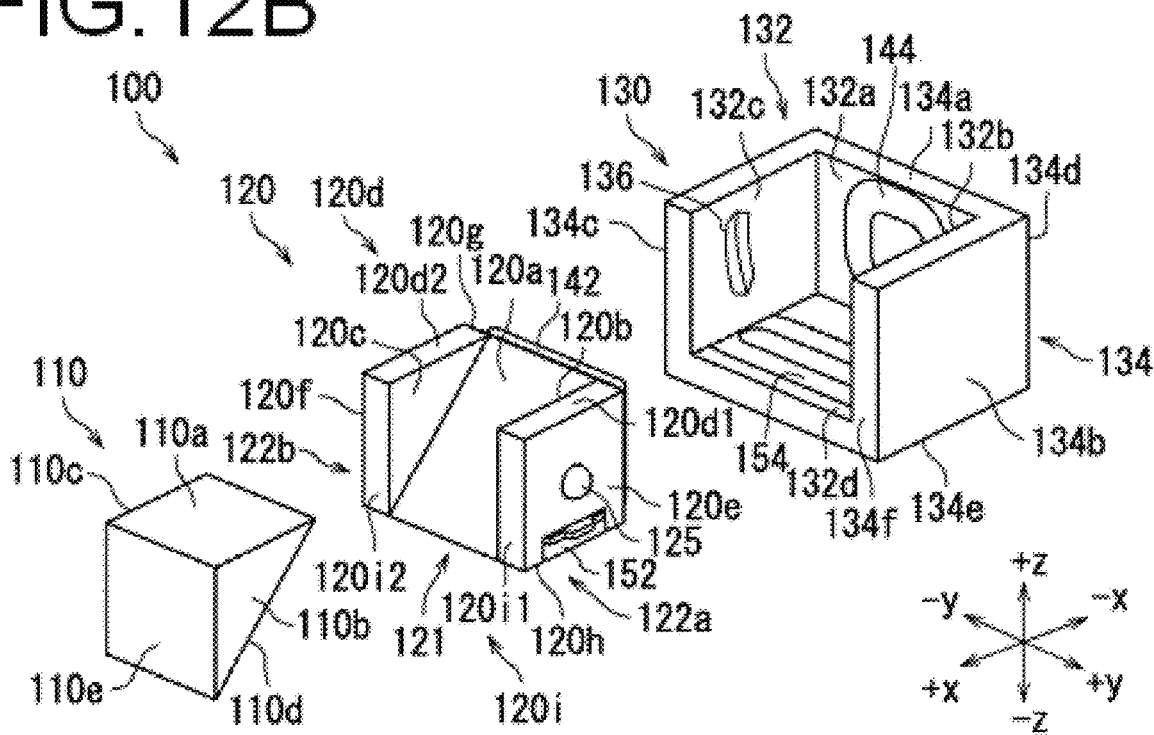

FIGS. 12A and 12B are schematic exploded perspective views of an optical element, a holder, and a case in the optical assembly according to the modification of the first example embodiment. The case 130 supports the holder 120 in a swingable manner. The case 130 supports the holder 120 from both ends in the y axis direction. The holder 120 swings with respect to the case 130. The holder 120 swings around the y axis with respect to the case 130. Further, the holder 120 swings around the x axis with respect to the case 130. On the other hand, in the optical assembly 100, the swing of the holder 120 around the z axis with respect to the case 130 is restricted.

The first swing mechanism 140 is located on the side in the −x direction with respect to the holder 120. The first swing mechanism 140 swings the holder 120 around the y axis with respect to the case 130.

The second swing mechanism 150 is located on the side in the −z direction with respect to the holder 120. The second swing mechanism 150 swings the holder 120 around the x axis with respect to the case 130.

The case 130 has a first recess 135. The first recess 135 is formed in a first holder opposing surface (132b) that faces a first case opposing surface (120e) of the holder 120. The first recess 135 houses at least a part of the first protrusion 125. Here, the first recess 135 extends in the z axis direction. The length of the first recess 135 in the z axis direction is larger than the length of the first protrusion 125 in the z axis direction.

The case 130 has a second recess 136. The second recess 136 is formed in a second holder opposing surface (132c) that faces a second case opposing surface (120f) of the holder 120. The second recess 136 houses at least a part of the second protrusion 126. Here, the second recess 136 extends in the z axis direction. The length of the second recess 136 in the z axis direction is larger than the length of the second protrusion 126 in the z axis direction.

Figure 13A:
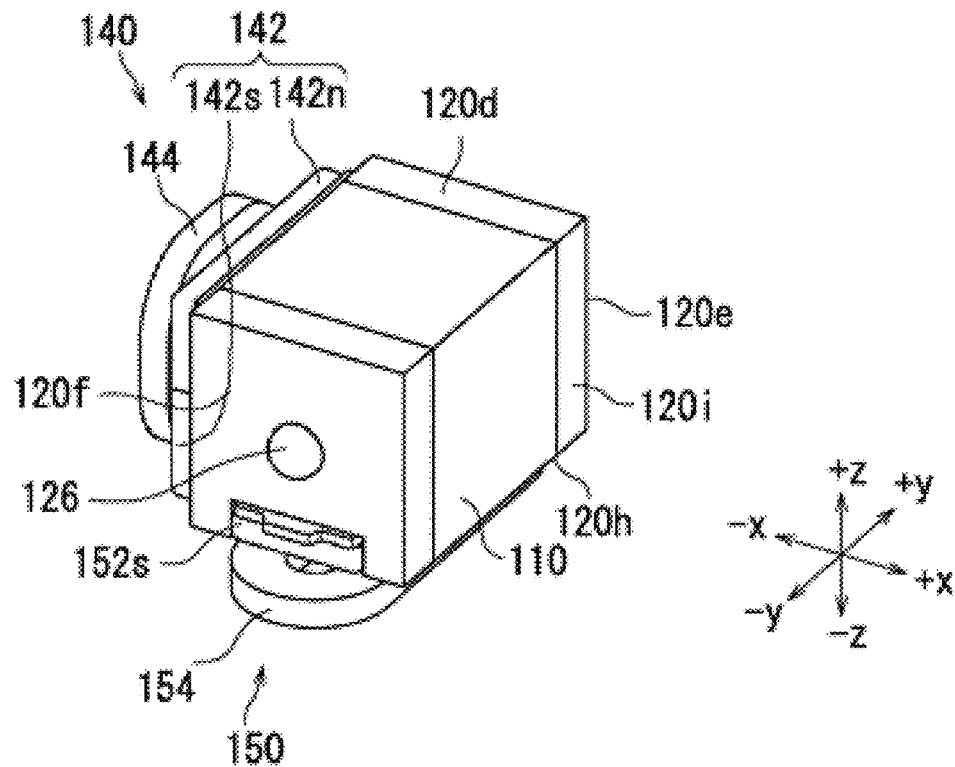
FIGS. 13A and 13B are schematic perspective views of a case, a first swing mechanism, and a second swing mechanism in the optical assembly according to the modification of the first example embodiment.
Figure 13B:
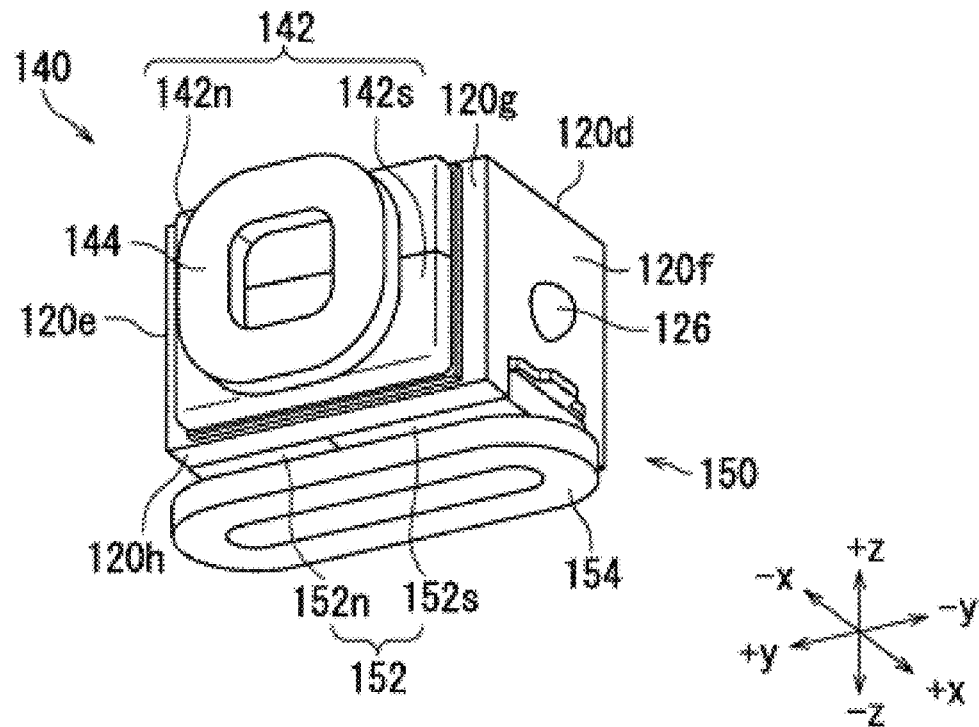

Next, the holder 120, the first swing mechanism 140, and the second swing mechanism 150 in the optical assembly 100 according to the modification of the first example embodiment will be described with reference to FIGS. 13A and 13B. FIGS. 13A and 13B are schematic perspective views of a case, the first swing mechanism, and the second swing mechanism in the optical assembly according to the modification of the first example embodiment. FIGS. 13A and 13B do not illustrate the case 130 except for a first coil 144 and a second coil 154.

The first swing mechanism 140 includes a first magnet 142 and the first coil 144. The first magnet 142 is provided on one of the holder 120 and the case 130, and the first coil 144 is provided on the other of the holder 120 and the case 130 with respect to the first magnet 142. Specifically, one of the first magnet 142 and the first coil 144 is provided on the surface 120g of the holder 120, and the other of the first magnet 142 and the first coil 144 is provided on the surface 132a of the case 130 or inside the case 130 at a position facing the surface 132a.

Here, the first magnet 142 is attached to the holder 120. Specifically, the first magnet 142 is attached to the surface 120g of the holder 120. The first magnet 142 has an N pole 142n and an S pole 142s. The N pole 142n and the S pole 142s each extend in the y direction and are arranged side by side in the z direction.

The first coil 144 is provided in the case 130. By switching the direction of a current flowing through the first coil 144, the first magnet 142 receives a force along the z axis direction.

The second swing mechanism 150 includes a second magnet 152 and the second coil 154. The second magnet 152 is provided on one of the holder 120 and the case 130, and the second coil 154 is provided on the other of the holder 120 and the case 130 with respect to the second magnet 152. Specifically, one of the second magnet 152 and the second coil 154 is provided on the surface 120h of the holder 120, and the other of the second magnet 152 and the second coil 154 is provided on the surface 132d of the case 130 or inside the case 130 at a position facing the surface 132d.

Here, the second magnet 152 is attached to the holder 120. Specifically, the second magnet 152 is attached to the surface 120h of the holder 120. The second magnet 152 has an N pole 152n and an S pole 152s. The N pole 152n and the S pole 152s each extend in the x direction and are arranged side by side in the y direction.

The second coil 154 is provided in the case 130. By switching the direction of a current flowing through the second coil 154, the second magnet 152 receives a force along the y axis direction.

As in the first example embodiment, it is preferred that the holder 120 includes the first magnet 142 and the second magnet 152, and the case 130 includes the first coil 144 and the second coil 154. With this configuration, the swing of the holder 120 with respect to the case 130 can be easily controlled by passing a current through the first coil 144 and/or the second coil 154 of the case 130.

Figure 14A:
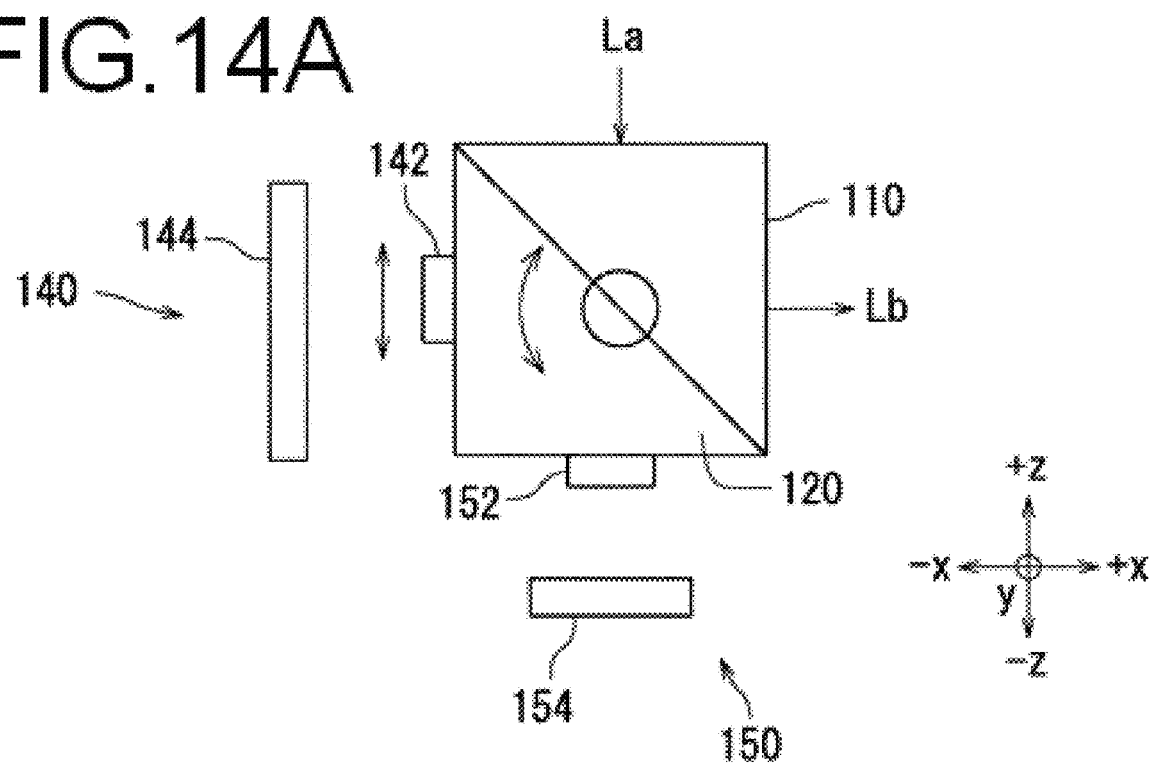
FIG. 14A is a schematic diagram describing the swing of the optical assembly according to the modification of the first example embodiment by the first swing mechanism.

Next, the swing of the optical assembly 100 according to the modification of the first example embodiment will be described with reference to FIGS. 14A and 14B. FIG. 14A is a schematic diagram for describing the swing of the optical assembly 100 according to the modification of the first example embodiment by the first swing mechanism 140, and FIG. 14B is a schematic diagram for describing the swing of the optical assembly 100 according to the modification of the first example embodiment by the second swing mechanism 150.

As shown in FIG. 14A, the first swing mechanism 140 includes the first magnet 142 and the first coil 144. The first magnet 142 is provided to the holder 120, and the first coil 144 is provided to the case 130. Further, the second swing mechanism 150 includes the second magnet 152 and the second coil 154. The second magnet 152 is provided to the holder 120, and the second coil 154 is provided to the case 130.

By switching the direction of a current flowing through the first coil 144, the first magnet 142 receives a force along the z axis direction. In this case, the first magnet 142 moves along the z axis direction. Therefore, the holder 120 to which the first magnet 142 is attached swings around the y axis with respect to the case 130.

Figure 14B:
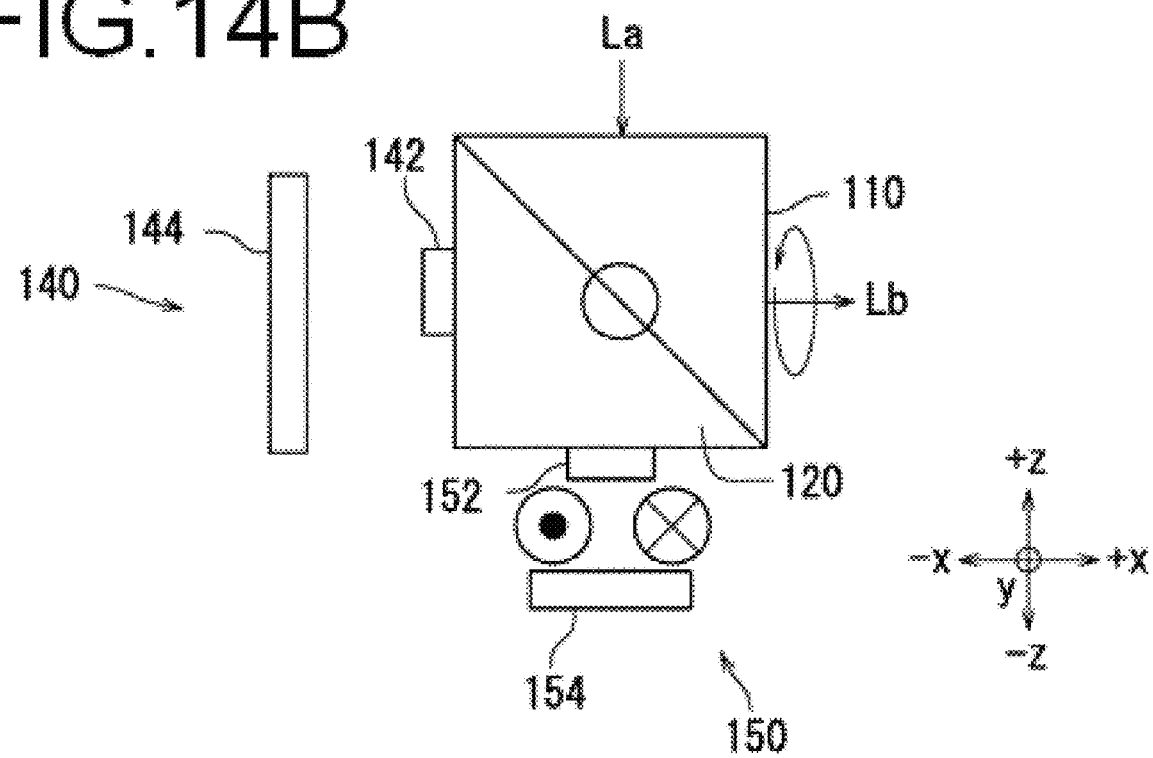
FIG. 14B is a schematic diagram describing the swing of the optical assembly according to the modification of the first example embodiment by the second swing mechanism.

As shown in FIG. 14B, the second magnet 152 receives a force along the y axis direction by switching the direction of the current flowing through the second coil 154. In this case, the second magnet 152 moves along the y axis direction. Therefore, the holder 120 to which the second magnet 152 is attached swings around the x axis with respect to the case 130.

Figure 15A:
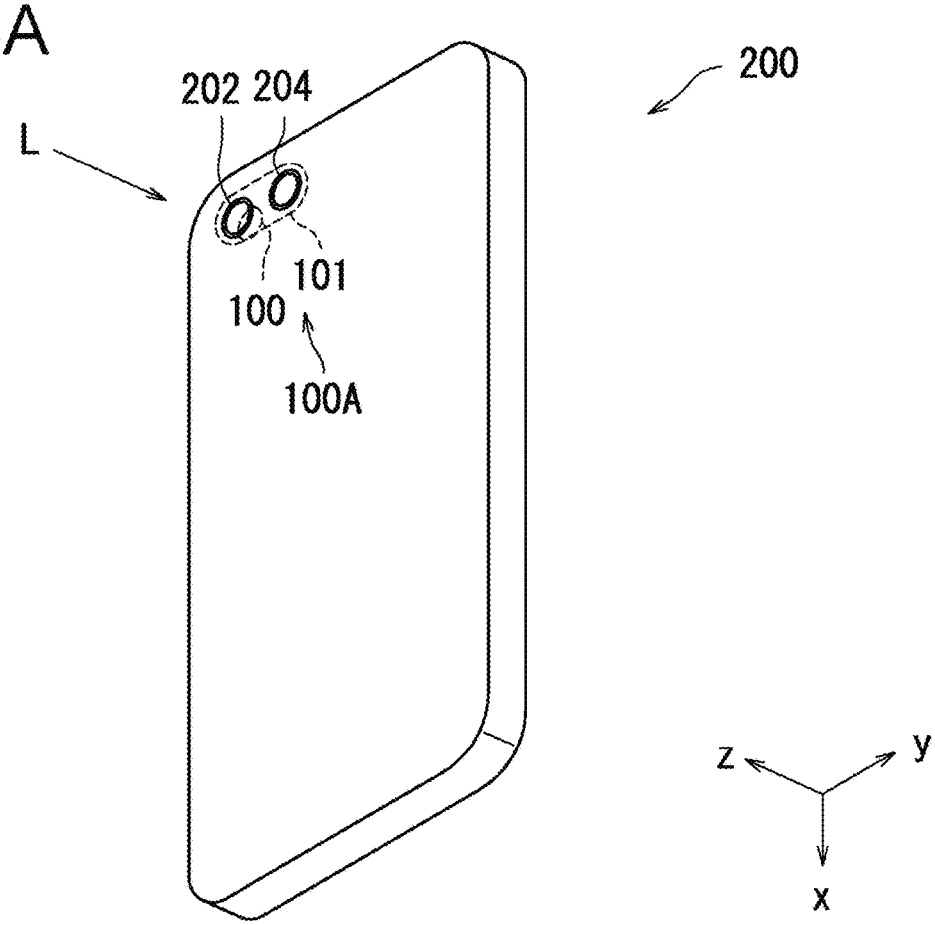
FIG. 15A is a schematic perspective view of a smartphone equipped with the optical assembly according to the first example embodiment.

Next, an optical module 100A equipped with the optical assembly 100 according to the present example embodiment will be described with reference to FIGS. 15A and 15B. FIG. 15A is a schematic perspective view of a smartphone 200 equipped with the optical module 100A including the optical assembly 100 according to the present example embodiment and another optical assembly 101.

As shown in FIG. 15A, the smartphone 200 can capture two types of images. The smartphone 200 includes a lens 202 and a lens 204 on which light is incident. In the smartphone 200, the optical module 100A is located inside the lens 202 and the lens 204. Specifically, the lens 202 is disposed corresponding to the optical assembly 100, and the lens 204 is disposed corresponding to the optical assembly 101.

Light L enters the smartphone 200 from the outside through the lens 202 in the incident direction, and a subject image is captured on the basis of the light that has passed through the optical assembly 100. Similarly, light L enters from the outside through the lens 204 in the incident direction, and a subject image is captured on the basis of light that has passed through the optical assembly 101.

Figure 15B:
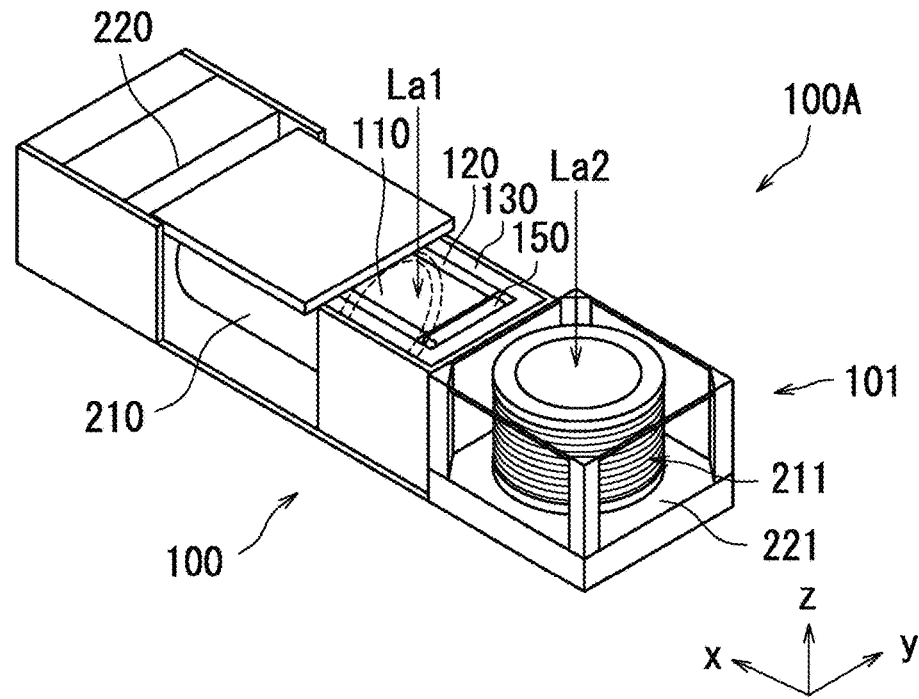
FIG. 15B is a schematic perspective view of an optical module equipped with the optical assembly according to the first example embodiment.

FIG. 15B is a schematic perspective view of the optical module 100A according to the present example embodiment. The optical module 100A in FIGS. 15A and 15B includes the optical assembly 100 having the same configuration as described above and another optical assembly 101.

As shown in FIG. 15B, the optical assembly 100 reflects incident light La1 incident along the z axis direction as reflected light Lb with the optical axis along the x axis direction. Thereafter, the reflected light Lb is received by the image sensor 220 via the lens module 210 of the smartphone 200. The lens module 210 includes various lenses depending on intended use.

The optical assembly 101 receives incident light La2 incident along the z axis direction. The optical assembly 101 receives light from an image sensor 221 via a lens module 211 without changing the direction of the optical axis from the z axis direction. The lens module 211 includes various lenses depending on intended use.

In the above description, a smartphone is indicated as an example to which the optical assembly 100 according to the present example embodiment is applied. However, the optical assembly 100 is not limited to be applied to the smartphone. The optical assembly 100 is preferably used for a digital camera or a video camera. For example, the optical assembly 100 may be used as a part of a dashboard camera. Alternatively, the optical assembly 100 may be mounted on a camera for a flight vehicle (for example, a drone).

The example embodiment of the present disclosure has been described above with reference to the drawings. However, the present disclosure is not limited to the above example embodiment, and can be implemented in various modes without departing from the gist of the present disclosure. In addition, various disclosures are possible by appropriately combining the plurality of components described in the above example embodiment. For example, some components may be removed from all the components described in the example embodiment. In addition, components in different example embodiments may be combined as appropriate. The components in the drawings are mainly and schematically illustrated to facilitate better understanding, and the thickness, length, number, spacing, etc. of each component illustrated in the drawings may differ from actual values for the convenience of creating drawings. Further, the material, shape, dimensions, etc. of each component described in the above example embodiment are merely examples, and are not particularly limited, and various modifications are possible without substantially departing from the effects of the present disclosure.

Features of the above-described preferred example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An optical assembly comprising:
an optical element including a reflection surface to reflect light in a first axis direction;
a holder to hold the optical element;
a case to support the holder in a swingable manner;
a first swing mechanism to swing the holder around a first swing axis with respect to the case; and
a second swing mechanism to swing the holder around a second swing axis perpendicular or substantially perpendicular to the first swing axis with respect to the case; wherein
the holder includes:
  a first protrusion on a first case opposing surface that opposes the case, the first protrusion protruding toward the case; and
  a second protrusion on a second case opposing surface that opposes the case, the second protrusion protruding toward the case;
the case includes:
  a first recess in a first holder opposing surface that opposes the first case opposing surface of the holder, the first recess housing at least a portion of the first protrusion; and
  a second recess in a second holder opposing surface that opposes the second case opposing surface of the holder, the second recess housing at least a portion of the second protrusion;
the first recess includes:
  a first side surface located on one side in an axial direction of the second swing axis with respect to the first protrusion; and
  a second side surface located on the other side in the axial direction of the second swing axis with respect to the first protrusion;
the second recess includes:
  a first side surface located on one side in the axial direction of the second swing axis with respect to the second protrusion; and
  a second side surface located on another side in the axial direction of the second swing axis with respect to the second protrusion, the second side surface being connected to the first side surface;
at least one of the first side surface and the second side surface of the first recess includes an inclined surface inclined with respect to the second swing axis; and
at least one of the first side surface and the second side surface of the second recess includes an inclined surface inclined with respect to the second swing axis.

2. The optical assembly according to claim 1, wherein
the inclined surface of the first recess is an inclined surface in which a distance between the first side surface and the second side surface in the axial direction of the second swing axis decreases toward an outside in a radial direction around the second swing axis; and
the inclined surface of the second recess is an inclined surface in which a distance between the first side surface and the second side surface in the axial direction of the second swing axis decreases toward an outside in a radial direction around the second swing axis.

3. The optical assembly according to claim 1, wherein
the first protrusion partially has a spherical shape; and
the second protrusion partially has a spherical shape.

4. The optical assembly according to claim 1, wherein
the first recess includes a connection portion between the first side surface and the second side surface; and
the second recess includes a connection portion between the first side surface and the second side surface;
the connection portion of the first recess and the connection portion of the second recess defining a portion of the same circle as viewed in the axial direction of the second swing axis.

5. The optical assembly according to claim 1, wherein
the another of the first side surface and the second side surface of the first recess also includes an inclined surface inclined with respect to the second swing axis; and
the another of the first side surface and the second side surface of the second recess also includes an inclined surface inclined with respect to the second swing axis.

6. The optical assembly according to claim 1, wherein
the another of the first side surface and the second side surface of the first recess is parallel to a second axis direction; and
the another of the first side surface and the second side surface of the second recess is parallel to the second axis direction.

7. The optical assembly according to claim 1, wherein the optical element includes a prism.

8. The optical assembly according to claim 1, wherein the first swing mechanism includes:
  a first magnet provided on one of the holder and the case; and
  a first coil provided on the other of the holder and the case with respect to the first magnet; and the second swing mechanism includes:
- a second magnet provided on one of the holder and the case; and
- a second coil provided on the other of the holder and the case with respect to the second magnet.

9. The optical assembly according to claim 8, wherein the case further includes a Hall element.

10. The optical assembly according to claim 1, wherein
at least one of the first side surface and the second side surface of the first recess is connected to the other one of the first side surface and the second side surface of the first recess with a constant inclination as viewed in a circumferential direction around the second swing axis; and
at least one of the first side surface and the second side surface of the second recess is connected to the other of the first side surface and the second side surface of the second recess with a constant inclination as viewed in the circumferential direction around the second swing axis.

11. The optical assembly according to claim 1, wherein
the first side surface and the second side surface of the first recess are symmetrical with respect to a plane perpendicular or substantially perpendicular to the second swing axis; and
the first side surface and the second side surface of the second recess are symmetrical with respect to the plane perpendicular or substantially perpendicular to the second swing axis.

12. The optical assembly according to claim 1, wherein
the first side surface and the second side surface are connected by a surface extending in the direction of the second swing axis.

13. The optical assembly according to claim 1, wherein
the first case opposing surface includes a preload mechanism to push the first protrusion toward the case; and
the second case opposing surface includes a preload mechanism to pushes the second protrusion toward the case.

* * * * *